US008772902B2

(12) United States Patent
Assefa et al.

(10) Patent No.: US 8,772,902 B2
(45) Date of Patent: Jul. 8, 2014

(54) FABRICATION OF A LOCALIZED THICK BOX WITH PLANAR OXIDE/SOI INTERFACE ON BULK SILICON SUBSTRATE FOR SILICON PHOTONICS INTEGRATION

(75) Inventors: Solomon Assefa, Ossining, NY (US);
William M. J. Green, Astoria, NY (US);
Marwan H. Khater, Astoria, NY (US);
Yurii A. Vlasov, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/451,141

(22) Filed: Apr. 19, 2012

(65) Prior Publication Data

US 2013/0277795 A1    Oct. 24, 2013

(51) Int. Cl.
*H01L 21/70* (2006.01)

(52) U.S. Cl.
USPC ............ 257/506; 257/510; 257/520; 438/424

(58) Field of Classification Search
USPC ......... 257/347–350, 354, 355, 365, 507, 510, 257/653, 506, 520; 438/152–154, 199, 438/404–413, 455, 551, 761, 424
See application file for complete search history.

(56) References Cited

U.S. PATENT DOCUMENTS

| | | | |
|---|---|---|---|
| 3,961,999 A | | 6/1976 | Antipov |
| 4,837,186 A | * | 6/1989 | Ohata et al. .................... 438/455 |
| 5,229,318 A | | 7/1993 | Straboni et al. |
| 6,214,694 B1 | * | 4/2001 | Leobandung et al. ........ 438/413 |
| 6,235,638 B1 | | 5/2001 | Huang et al. |
| 6,579,777 B1 | | 6/2003 | Yen et al. |
| 6,825,534 B2 | * | 11/2004 | Chen et al. ..................... 257/354 |
| 7,018,904 B2 | * | 3/2006 | Yamada et al. ................ 438/404 |
| 8,222,093 B2 | * | 7/2012 | Ng et al. ........................ 438/151 |
| 2002/0148807 A1 | | 10/2002 | Zhao et al. |
| 2004/0023473 A1 | * | 2/2004 | Divakaruni et al. .......... 438/551 |
| 2007/0278183 A1 | | 12/2007 | Lee et al. |
| 2010/0059822 A1 | | 3/2010 | Pinguet et al. |

OTHER PUBLICATIONS

Sherwood-Droz, N. et al., "Oxidized Silicon-on-Insulator (OxSOI) from Bulk Silicon: A New Photonic Platform" Optics Express, Optical Society of America (Mar. 2010) pp. 5785-5790, vol. 18, No. 6.

(Continued)

*Primary Examiner* — Kimberly Rizkallah
*Assistant Examiner* — Errol Fernandes
(74) *Attorney, Agent, or Firm* — Scully, Scott, Murphy & Presser, P.C.; Vazken Alexanian

(57) ABSTRACT

Line trenches are formed in a stack of a bulk semiconductor substrate and an oxygen-impermeable layer such that the depth of the trenches in the bulk semiconductor substrate is greater than the lateral spacing between a pair of adjacently located line trenches. Oxygen-impermeable spacers are formed on sidewalls of the line trenches. An isotropic etch, either alone or in combination with oxidation, removes a semiconductor material from below the oxygen-impermeable spacers to expand the lateral extent of expanded-bottom portions of the line trenches, and to reduce the lateral spacing between adjacent expanded-bottom portions. The semiconductor material around the bottom portions is oxidized to form a semiconductor oxide portion that underlies multiple oxygen-impermeable spacers. Semiconductor-on-insulator (SOI) portions are formed above the semiconductor oxide portion and within the bulk semiconductor substrate.

12 Claims, 22 Drawing Sheets

(56) References Cited

OTHER PUBLICATIONS

Holzwarth, C. W. et al., "Localized Substrate Removal Technique Enabling Strong-Confinement Microphotonics in Bulk Si CMOS Processes" OSA Technical Digest (CD), Optical Society of America (May 4-9, 2008) pp. 1-2.

Ji, H. et al., "Bulk silicon photonic wire for one-chip integrated optical interconnection" Group IV Photonics (GFP), 7th IEEE International Conference (Sep. 2010) pp. 96-98.

Moselund, K.E. et al., "Cointegration of Gate-all-Around MOSFETs and Local Silicon-on-Insulator Optical Waveguides on Bulk Silicon" IEEE Transactions on Nanotechnology (Jan. 2007) pp. 118-125, vol. 6, No. 1.

* cited by examiner

FABRICATION OF A LOCALIZED THICK BOX WITH PLANAR OXIDE/SOI INTERFACE ON BULK SILICON SUBSTRATE FOR SILICON PHOTONICS INTEGRATION

BACKGROUND

The present disclosure relates to fabrication of localized thick BOX on bulk Silicon substrate for silicon photonics device components (i.e. waveguides, modulators, etc.) integration with bulk device technologies, such as CMOS, Bipolar transistor, and DRAM, and a method of manufacturing the same.

Photonic devices are useful as communication devices. Stand-alone photonic devices require an interface with optical fibers. A circuit including multiple photonic devices thus becomes not only bulky in size, but also economically disadvantageous. In order to fully utilize the functionalities of photonic devices, therefore, it is necessary to integrate photonic devices with other photonic devices and other types of devices such as semiconductor devices.

Integration of photonic devices with semiconductor devices such as complementary metal oxide semiconductor (CMOS) devices and/or bipolar complementary metal oxide semiconductor (BiCMOS) devices can provide on-chip and chip-to-chip optical interconnections. However, photonic devices and semiconductor devices can require different types of substrates. While many CMOS devices and BiCMOS devices require a bulk semiconductor substrate, many photonic devices require an SOI substrate, which is more expensive than bulk substrates. Thus, there is a need to enable formation of such photonic devices and CMOS/BiCMOS devices on a same substrate in an economical manner.

BRIEF SUMMARY

Line trenches are formed in a stack of a bulk semiconductor substrate and an oxygen-impermeable layer such that the depth of the trenches in the bulk semiconductor substrate is greater than the lateral spacing between a pair of adjacently located line trenches. Oxygen-impermeable spacers are formed on sidewalls of the line trenches. An isotropic etch, either alone or in combination with oxidation, removes a semiconductor material from below the oxygen-impermeable spacers to expand the lateral extent of expanded-bottom portions of the line trenches, and to reduce the lateral spacing between adjacent expanded-bottom portions. The semiconductor material around the bottom portions is oxidized to form a semiconductor oxide portion that underlies multiple oxygen-impermeable spacers. Semiconductor-on-insulator (SOI) portions are formed above the semiconductor oxide portion and within the bulk semiconductor substrate.

According to an aspect of the present disclosure, a semiconductor structure includes a semiconductor oxide portion embedded within a semiconductor substrate. The semiconductor substrate contiguously extends from a first portion underlying the semiconductor oxide portion to second portion overlying a peripheral portion of the semiconductor oxide portion. The semiconductor structure further includes a semiconductor material portion in contact with a top surface of the semiconductor oxide portion and including a same semiconductor material as the second portion; a first line trench located on one side of the semiconductor material portion and extending into the semiconductor oxide portion; and a second line trench located on an opposite side of the semiconductor material portion and extending into the semiconductor oxide portion. The semiconductor material portion laterally extends between a first sidewall of the first line trench and a second sidewall of the second line trench, and is laterally spaced from the second portion by one of the first line trench and the second line trench.

According to another aspect of the present disclosure, a method of forming a semiconductor structure is provided. The method includes: forming an oxygen-impermeable layer on a semiconductor substrate; forming first and second line trenches that are laterally separated by a lateral distance through the oxygen-impermeable layer and an upper portion of the semiconductor substrate; forming oxygen-impermeable spacers on sidewalls of the first and second line trenches; removing a semiconductor material portion from underneath a bottom semiconductor surface of each of the first and second of line trenches; and oxidizing a semiconductor material in the semiconductor substrate around bottom portions of the first and second line trenches. A semiconductor oxide portion formed by oxidation contiguously extends laterally between the first and second line trenches and underneath first and second line trenches, and vertically separates an overlying semiconductor material portion from an underlying portion of the semiconductor substrate.

DETAILED DESCRIPTION

Figure 1:
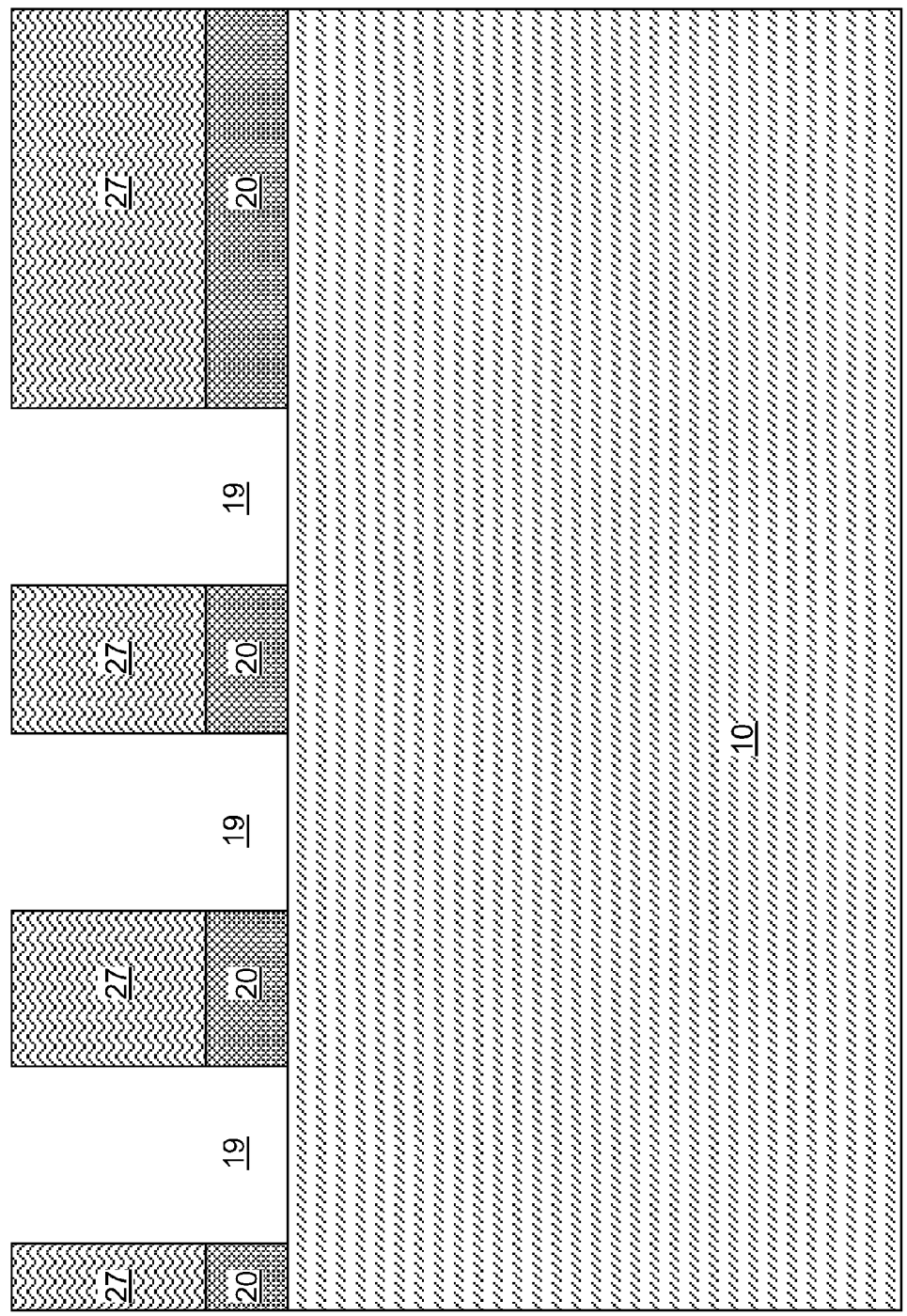
FIG. 1 is a vertical cross-sectional view of a first exemplary semiconductor structure after formation and patterning of an oxygen-impermeable layer according to a first embodiment of the present disclosure.

As stated above, the present disclosure relates to fabrication of thick localized BOX on bulk Silicon substrate for silicon photonics device components (i.e. waveguides, modulators, etc.) integration with bulk device technologies, such as CMOS, heterojunction Bipolar transistor, and DRAM, and a method of manufacturing the same, which are now described in detail with accompanying figures. It is noted that like reference numerals refer to like elements across different embodiments. Further, elements with common features are referred to with the same reference numeral. The drawings are not necessarily drawn to scale.

Referring to FIG. 1, a first exemplary semiconductor structure according to a first embodiment of the present disclosure includes a semiconductor substrate 10. The semiconductor substrate 10 can be a bulk silicon substrate having a semiconductor material between a planar top surface and a planar bottom surface. In one embodiment, the semiconductor substrate 10 can include a same single crystalline semiconductor material throughout the entirety thereof.

The semiconductor substrate 10 includes a semiconductor material, which can be an elemental semiconductor material such as silicon, germanium, and carbon, an alloy of at least two elemental semiconductor materials such as a silicon-germanium alloy, a III-V compound semiconductor material, a II-VI compound semiconductor material, or an alloy or a stack thereof. For example, the entirety of the semiconductor substrate 10 can be a single crystalline silicon layer, a single crystalline silicon-germanium alloy layer, a single crystalline silicon-carbon alloy layer, or a single crystalline silicon-germanium-carbon alloy layer.

In one embodiment, the semiconductor substrate 10 can be a bulk single crystalline silicon substrate including at least one doped or undoped semiconductor material throughout the entirety thereof. The semiconductor substrate 10 can be undoped, have a homogeneous doping of p-type or n-type, or can have a plurality of doped semiconductor portions having different dopant concentrations and/or different conductivity types (i.e., p-type or n-type). The thickness of the semiconductor substrate 10 can be from 50 micron to 2 cm, although lesser and greater thicknesses can also be employed.

An oxygen-impermeable layer 20 is formed as a blanket layer, i.e., a contiguous layer having the same thickness throughout and not including any hole therein, on the top surface of the semiconductor substrate 10. As used herein, an "oxygen-impermeable" element is an element that is not permeable to oxygen. The oxygen-impermeable layer 20 includes at least an oxygen-impermeable material such as silicon nitride, a dielectric metallic nitride, or a conductive metallic nitride. In one embodiment, the oxygen-impermeable layer 20 includes silicon nitride. The oxygen-impermeable material of the oxygen-impermeable layer 20 can be in contact with the top surface of the semiconductor substrate 10.

Optionally, the oxygen-impermeable layer 20 can further include an additional dielectric material layer in an upper portion thereof. The optional additional dielectric material layer can include, for example, undoped silicon oxide or doped silicon oxide.

The oxygen-impermeable layer 20 can be deposited, for example, by chemical vapor deposition (CVD) or atomic layer deposition (ALD). The thickness of the oxygen-impermeable layer 20 can be from 5 nm to 1,000 nm, although lesser and greater thicknesses can also be employed.

A photoresist 27 is applied over the top surface of the oxygen-impermeable layer 20, and is patterned by lithographic exposure and development. The pattern in the photoresist 27 is transferred into the oxygen-impermeable layer 20 to form openings 19 therein. The openings 19 in the oxygen-impermeable layer can be formed in the pattern of line cavities, i.e., cavities having a greater dimension along a lengthwise direction that along a widthwise dimension. The vertical cross-sectional view of FIG. 1 is along the widthwise direction of parallel line cavities. In one embodiment, some of the line cavities can be parallel to one another. The photoresist 27 can be removed after the top surface of the semiconductor substrate 10 is physically exposed at the bottom of each opening 19.

Figure 2:
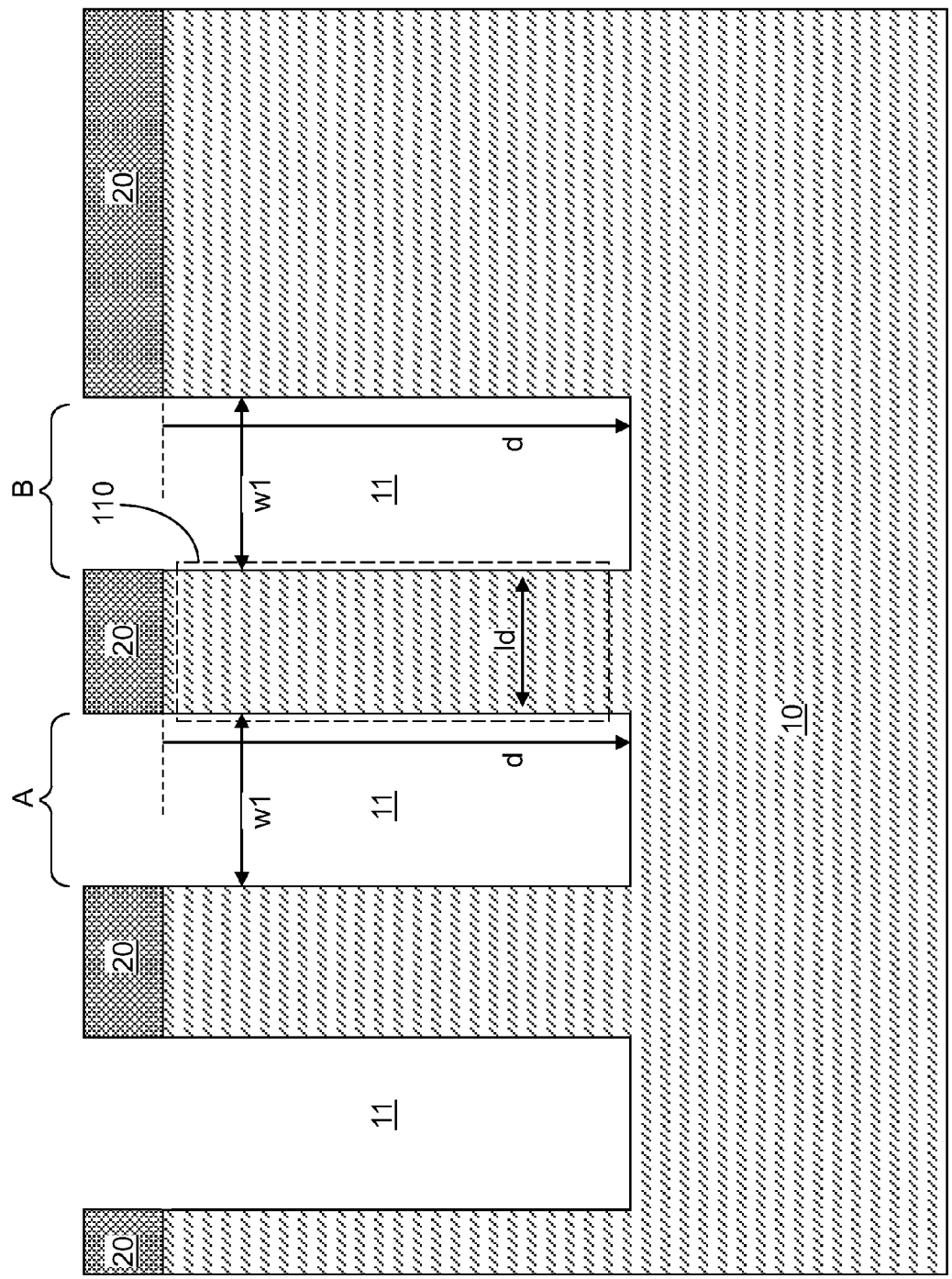
FIG. 2 is a vertical cross-sectional view of the first exemplary semiconductor structure after formation of line trenches according to the first embodiment of the present disclosure.

Referring to FIG. 2, the pattern of the openings 19 in the oxygen-impermeable layer 20 is transferred into an upper portion of the semiconductor substrate 10 by an anisotropic etch. The anisotropic etch etches the semiconductor material of the semiconductor substrate 10 selective to the material of the oxygen-impermeable 20. Line trenches 11 that replicate the pattern of the openings 19 in the oxygen-impermeable layer 20 are formed in the upper portion of the semiconductor substrate 10. The line trenches 11 have a depth d as measured from the top surface of the semiconductor substrate 10 to the bottom surfaces of the line trenches 11.

In one embodiment, a first line trench 11, e.g., the line trench 11 in region A in FIG. 2, and a second line trench 11, i.e., the line trench 11 in region B in FIG. 2, are laterally separated by a lateral distance 1d through the oxygen-impermeable layer 20 and the upper portion of the semiconductor substrate 10. A portion of the semiconductor substrate 10 between the two line trenches 11 has a width, which is the lateral distance 1d between the two line trenches 11. This portion of the semiconductor substrate 10 is herein referred to as a laterally isolated semiconductor material portion 110. In one embodiment, the lateral distance 1d, i.e., the width of the laterally isolated semiconductor material portion 110, is less than the depth d of the two line trenches 11. Each of the two line trenches 11 laterally separates the laterally isolated semiconductor material portion 110 from the rest of the semiconductor substrate 10.

The line trenches 11 can have the same first width w1, or can have different first widths w1 that vary from one line trench to another line trench. The first width w1 of each line trench 11 can be, for example, in a range from 50 nm to 5,000 nm.

In one embodiment, the lateral distance 1d of the laterally isolated semiconductor material portion 110 can be selected to enable lateral confinement of electromagnetic radiation. For example, the lateral distance 1d of the laterally isolated semiconductor material portion 110 can be from 60 nm to 1,000 nm, although lesser and greater lateral distances 1d can also be employed.

Figure 3:
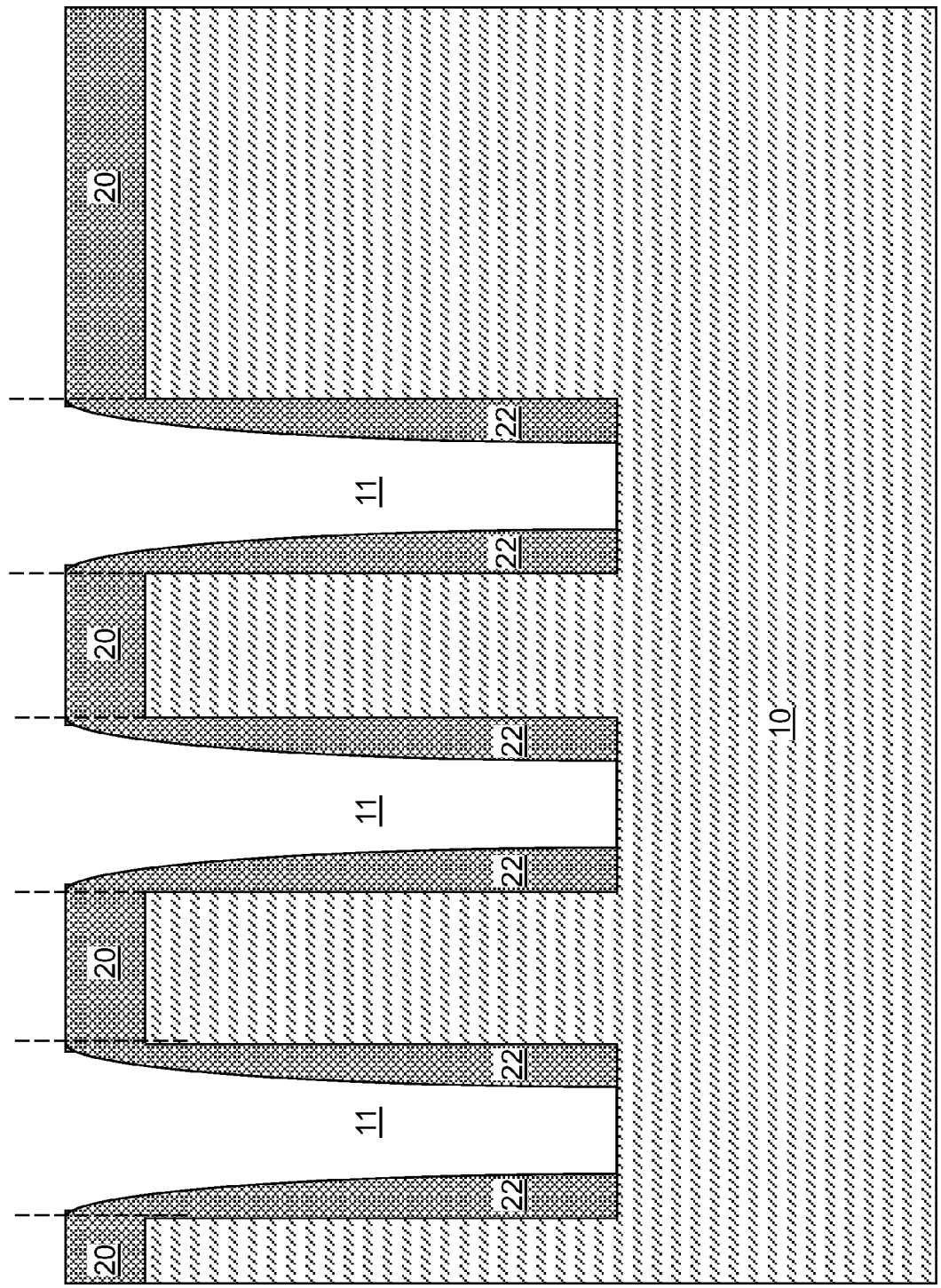
FIG. 3 is a vertical cross-sectional view of a first exemplary semiconductor structure after formation of oxygen-impermeable spacers according to the first embodiment of the present disclosure.

Referring to FIG. 3, a second oxygen-impermeable layer is conformally deposited on the sidewalls and bottom surfaces of the line trenches 11 and the top surface and the sidewalls of the oxygen-impermeable layer 20. The second oxygen-impermeable layer can include any material that can be employed for the oxygen-impermeable layer 20. The second oxygen-impermeable layer can include the same material as, or a different material from, the oxygen-impermeable layer 20. The second oxygen-impermeable layer can be deposited, for example, by chemical vapor deposition (CVD) or atomic layer deposition (ALD). The thickness of the second oxygen-impermeable layer can be less than the one half of the narrowest width of the line trenches 11. An anisotropic etch is performed, to remove horizontal portions of the second oxygen-impermeable layer from above the top surface of the oxygen-impermeable layer 20 and the bottom surface of the line trenches 11. The remaining vertical portions of the second oxygen-impermeable layer constitute oxygen-impermeable spacers 22, which contact all semiconductor sidewalls around the line trenches 11. After formation of the oxygen-impermeable spacers 22, a surface of the semiconductor substrate 10 can be physically exposed at the bottom of each line trench 11.

Figure 4:
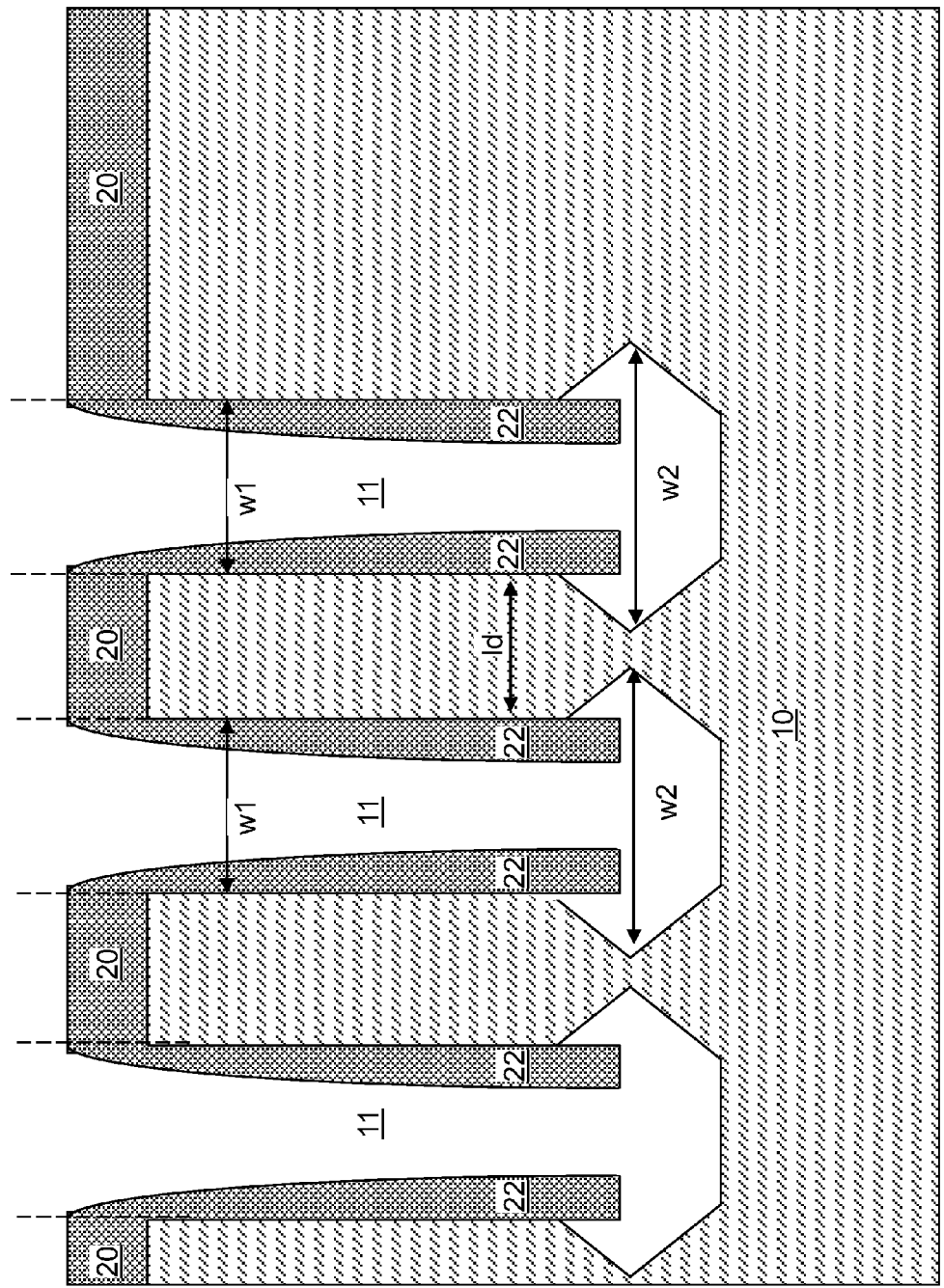
FIG. 4 is a vertical cross-sectional view of the first exemplary semiconductor structure after expanding bottom portions of the line cavities to form expanded-bottom line trenches according to the first embodiment of the present disclosure.

Referring to FIG. 4, a bottom portion of each line trench 11 is vertically and laterally expanded underneath the bottom surfaces of the oxygen-impermeable spacers 22 by at least one process. The at least one process removes the semiconductor material of the semiconductor substrate 10 from underneath the bottom surfaces of the line trenches 11. The at least one process can include one or more of an anisotropic dry etch process, an isotropic dry etch process, a wet etch process, and a combination of an oxidation step and an oxide etch step. A semiconductor material portion is removed from underneath a bottom semiconductor surface of each line trench 11.

An exemplary anisotropic dry etch is a reactive ion etch that employs a hydrofluorocarbon gas and oxygen. Exemplary isotropic dry etch processes include chemical dry etch (CDE) processes and an etch with HCl vapor at an elevated temperature. Any other anisotropic or isotropic dry etch that removes the semiconductor material of the semiconductor substrate 10 selective to the material of the oxygen-impermeable layer 20 and the oxygen-impermeable spacers 22 can also be employed. Exemplary wet etch processes include a wet etch employing a combination of hydrofluoric acid, nitric acid, and acetic acid, a wet etch employing a hydroxide solution including at least one of KOH, NaOH, CeOH, RbOH, NH4OH, tetramethylammonium hydroxide (TMAH), a wet etch employing ethylene diamine pyrocatechol (EDP), a wet etch employing a combination of hydrazine and water, and any other wet etch for etching the semiconductor material of the semiconductor substrate 10 selective to the material of the oxygen-impermeable layer 20 and the oxygen-impermeable spacers 22 as known in the art. The oxidation step can employ thermal oxidation or plasma oxidation. The oxide etch step can be any dry etch process or any wet etch process that removes the oxide of the semiconductor material of the semiconductor substrate 10 selective to the material of the oxygen-impermeable layer 20 and the oxygen-impermeable spacers 22.

A cavity having a second width w2 that is greater than the first width w1 of the overlying portion of the line trench 11 is formed underneath the bottom surfaces of the oxygen-impermeable spacers 22 in each line trench 11. Each line trench 11, as expanded by adding the volume of an underlying cavity underneath the bottom surfaces of the oxygen-impermeable spacers 22, is herein referred to as an expanded-bottom line trench. Each expanded-bottom line trench is a line trench 11 that includes an expanded bottom portion that is wider than the top portion of the line trench. Depending on the nature of the etch process employed to remove the semiconductor material of the semiconductor substrate 10 from underneath the bottom surfaces of the oxygen-impermeable spacers 22, the cavity in the lower portion of a line trench 11 may, or may not, include crystallographic facets. The cavity in a line trench 11 may extend above the bottom surfaces of the oxygen-impermeable spacers 22, or may be formed only underneath the bottom surfaces of the oxygen-impermeable spacers 22 depending on the etch processes employed to form the cavity. In one embodiment, the removal of the semiconductor material of the semiconductor substrate 10 can proceed until the lateral distance between an adjacent pair of cavities falls, for example, within a range from 5% to 95% of the lateral distance 1d.

The shape of the cavity can be made to achieve planar interface between the buried oxide formed by oxidation and the silicon on top of it to generate SOI on localized BOX for photonics device components with low optical loss.

Figure 5:
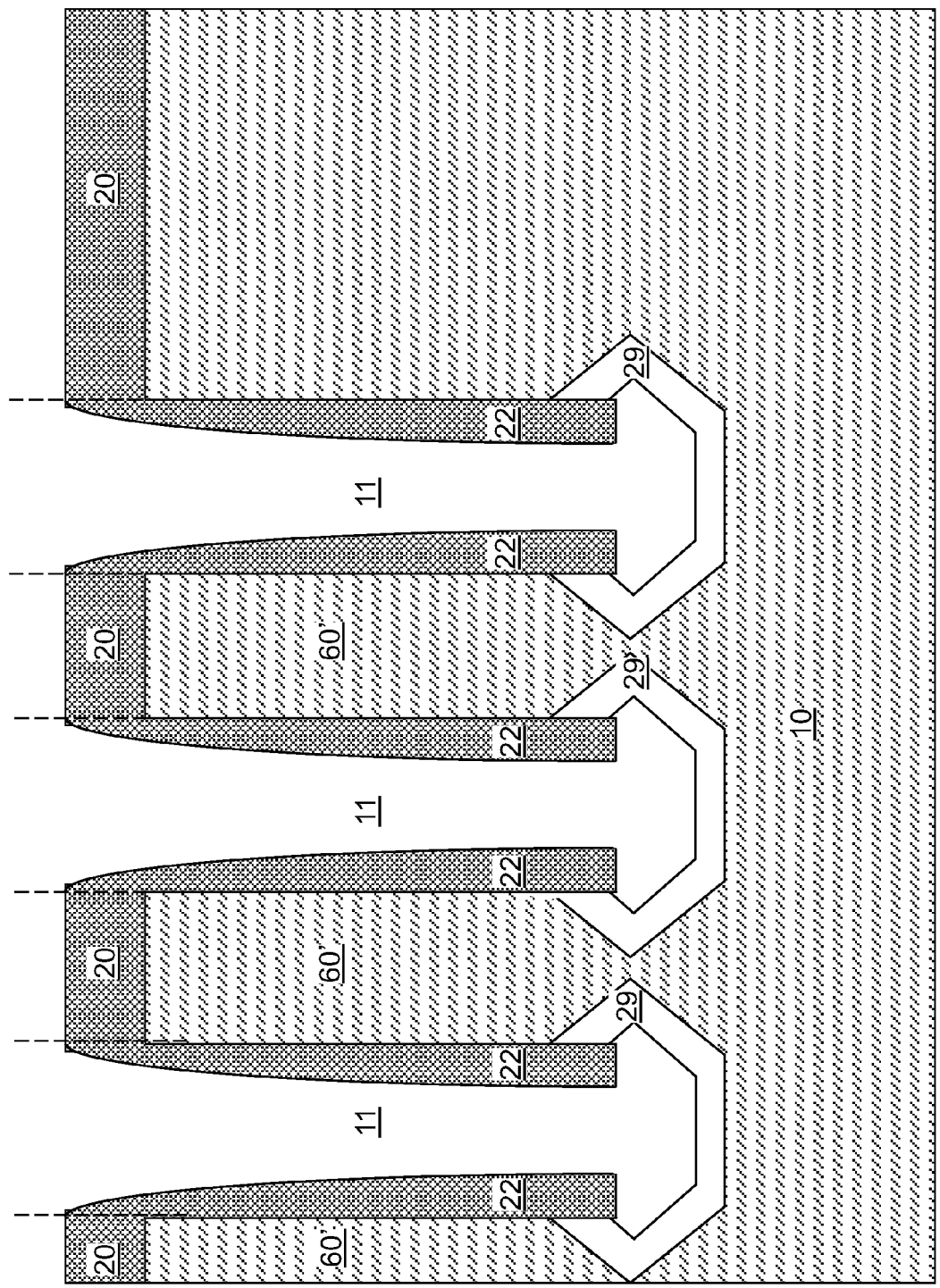
FIG. 5 is a vertical cross-sectional view of the first exemplary semiconductor structure after initiation of an oxidation process for conversion of physically exposed semiconductor portions into semiconductor oxide portions according to the first embodiment of the present disclosure.

Referring to FIG. 5, an oxidation process is performed to convert physically exposed semiconductor portions of the semiconductor substrate 10 around each cavity at a bottom portion of the line trench 11 into semiconductor oxide portions 29. The semiconductor oxide portions 29 include an oxide of the semiconductor material of the semiconductor substrate 10. The semiconductor oxide portions 29 begin to grow inward and outward from the original surface of the cavities of the expanded bottom line trenches 11 as illustrated in FIG. 4 because conversion of the semiconductor material into the semiconductor oxide material accompanies volume expansion. For example, if the semiconductor substrate 10 includes a single crystalline silicon material, the volume of each semiconductor oxide portion 29 is about 2.4 times the volume of the single crystalline silicon material that is consumed by the oxidation process. If thermal oxidation is employed to form the semiconductor oxide portions 29, the semiconductor oxide portions 29 include a thermal oxide of the semiconductor material that is stoichiometric. For example, if the semiconductor substrate 10 includes single crystalline silicon, the semiconductor oxide portions 29 can include a thermal silicon oxide, which is a stoichiometric silicon oxide in which the ratio of oxygen to silicon is 2 to 1.

Figure 6:
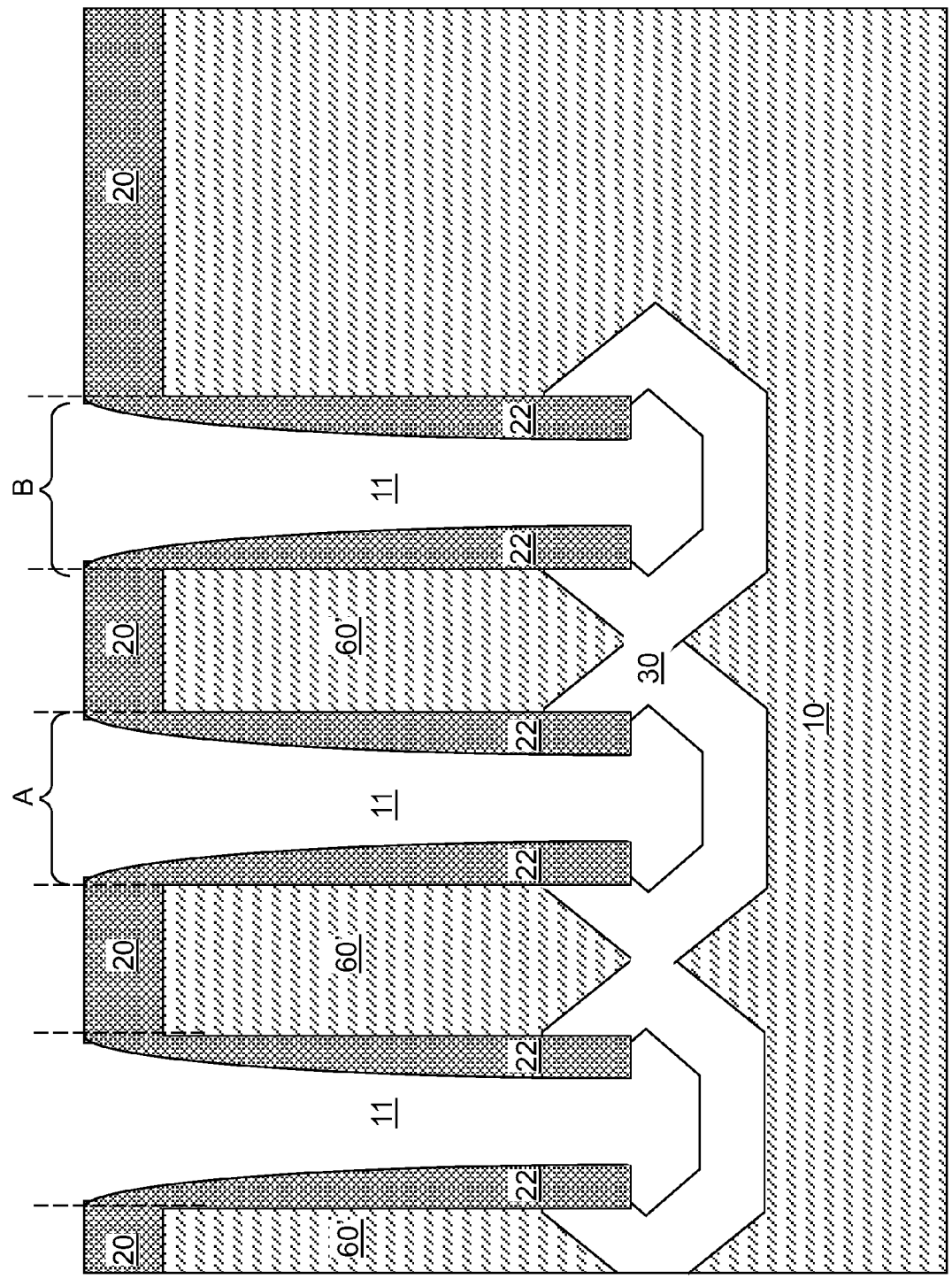
FIG. 6 is a vertical cross-sectional view of a variation of the first exemplary semiconductor structure after continued oxidation of the semiconductor material portions to form an integral semiconductor oxide portion according to the first embodiment of the present disclosure.

Referring to FIG. 6, the oxidation process proceeds further until previously laterally separated semiconductor oxide portions 29 merge with one another to form an integral contiguous semiconductor oxide portion 30, which is a semiconductor oxide portion of integral construction in which any point in the semiconductor oxide portion can be contiguously translated into any other point in the semiconductor oxide portion while remaining within the semiconductor oxide portion. Each laterally isolated semiconductor material portion 110 is vertically isolated from underlying portions of the semiconductor substrate 10 as the various semiconductor oxide portions 29 merge to form the integral contiguous semiconductor oxide portion 30. In other words, the integral contiguous semiconductor oxide portion 30 can vertically separate an overlying semiconductor material portion 60, which is derived from a laterally isolated semiconductor material portion 110 (See FIG. 2), from an underlying portion of the semiconductor substrate 10.

The integral contiguous semiconductor oxide portion 30 is contiguous throughout the entirety thereof, and laterally extends underneath a plurality of expanded-bottom line trenches 11'. The integral contiguous semiconductor oxide portion 30 can extend underneath a plurality of laterally isolated semiconductor material portion 110. For example, the integral contiguous semiconductor oxide portion 30 formed by oxidation can contiguously extends laterally between a first line trench 11 located in region A and a second line trench 11 located in region B, and further extends underneath the first line trench 11 in region A and the second line trench 11 in region B.

Figure 7:
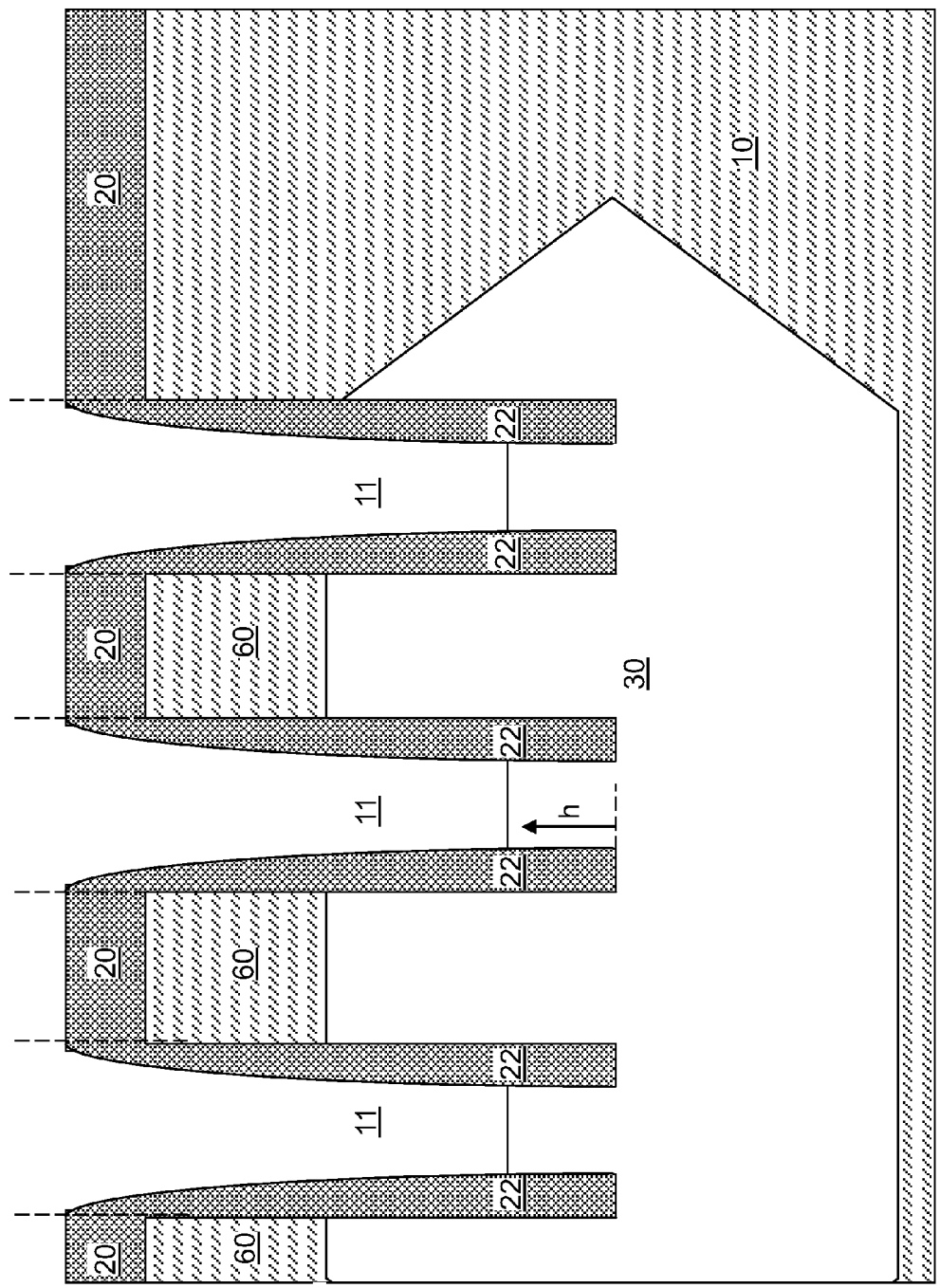
FIG. 7 is a vertical cross-sectional view of the variation of the first exemplary semiconductor structure after the integral semiconductor oxide portion is expanded after continued oxidation according to the first embodiment of the present disclosure.

As the oxidation process continues further, bottom portions of the semiconductor material portions 60 continue to be converted into a semiconductor oxide material. Referring to FIG. 7, the oxidation process can proceed even further at least until the interface between the integral contiguous semiconductor oxide portion 30 and the semiconductor material portions 60 becomes substantially planar. As used herein, an element is "substantially planar" if the deviation of the element from a plane is within the statistical atomic level variations inherent within semiconductor processing methods known in the art. In practical terms, the bottom surface of each semiconductor material portion 60 can be planar with less than 2 nm deviation from planarity. Further, the interface between the integral contiguous semiconductor oxide portion 30 and the semiconductor material portions 60 becomes substantially horizontal. As used herein, an element is "substantially horizontal" if the deviation of the element from a horizontal plane is within the statistical atomic level variations inherent within semiconductor processing methods known in the art. In practical terms, the bottom surface of each semiconductor material portion 60 can be planar with less than 2 nm deviation from a horizontal plane.

The continued expansion of the volume of the integral contiguous semiconductor oxide portion 30 reduces the size of the cavity at the bottom of each line trench 11. In one embodiment, the cavities at the bottom of the line trenches 11 can be filled with the integral contiguous semiconductor oxide portion 30, and the integral contiguous semiconductor oxide portion 30 can expand above the bottom surfaces of the oxygen-impermeable spacers 22. A continued oxidation of the semiconductor material of the semiconductor substrate 10 can cause top surfaces of the integral contiguous semiconductor oxide portion 30 to rise above the bottom surfaces of the oxygen-impermeable spacers 22 by a height h. In other words, the integral contiguous semiconductor oxide portion 30 fills lower portions of the line trenches 11 to the height h above the bottom surfaces of the oxygen-impermeable spacers 22.

Figure 8:
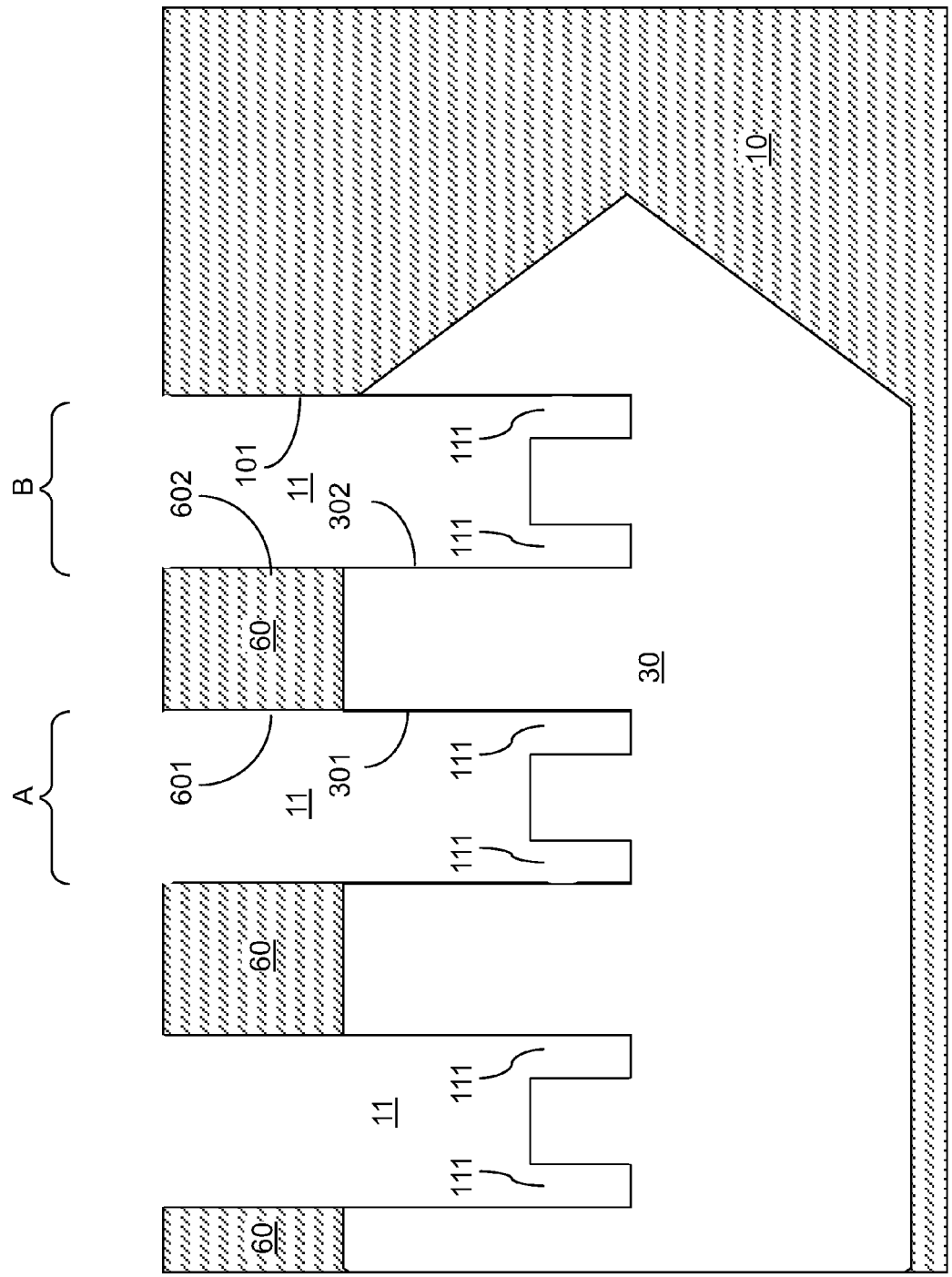
FIG. 8 is a vertical cross-sectional view of the first exemplary semiconductor structure after removal of the oxygen-impermeable layer and the oxygen-impermeable spacers according to the first embodiment of the present disclosure.

Referring to FIG. 8, the oxygen-impermeable layer 20 and at least upper portions of the oxygen-impermeable spacers 22 are removed selective to the semiconductor material of the semiconductor substrate 10 and the semiconductor material portions and selective to the semiconductor oxide of the integral contiguous semiconductor oxide portion 30. If the oxygen-impermeable layer 20 and the oxygen-impermeable spacers 22 include silicon nitride, a hot phosphoric acid etch can be employed to remove the oxygen-impermeable layer 20 and the oxygen-impermeable spacers 22. In one embodiment, the oxygen-impermeable spacers 22 can be completely removed.

Each semiconductor material portion 60 is laterally bounded by a pair of line trenches 11. For example, the semiconductor material portion 60 between region A and region B laterally extends between a first sidewall (601, 301) of a first line trench in region A and a second sidewall (602, 302) of a second line trench in region B. The first sidewall (601, 301) includes a first semiconductor sidewall 601 of the semiconductor material portion 60 and a first semiconductor oxide sidewall 301 of the integral semiconductor material portion 30. The second sidewall (602, 302) includes a second semiconductor sidewall 602 of the semiconductor material portion 60 and a second semiconductor oxide sidewall 301 of the semiconductor material portion 30.

In one embodiment, the first semiconductor sidewall 601 is parallel to the second semiconductor sidewall 602. In one embodiment, the first semiconductor sidewall 601 and the second semiconductor sidewall 602 are parallel to a sidewall 101 of the semiconductor substrate located across the second line trench 11 in region B. The first semiconductor oxide sidewall 301 can be vertically coincident with the first semiconductor sidewall 601, and the second semiconductor oxide sidewall 302 can be vertically coincident with the second semiconductor sidewall 602. As used herein, a first element is vertically coincident with a second element if the first element and the second element coincide in a top-down view.

A pair of grooves 111 can be formed under each line cavity 11 in the volumes from which the oxygen-impermeable spacers 22 are removed. For example, a first pair of grooves 111 is formed underneath the first line trench 11 in region A and a second pair of grooves 111 is formed underneath the second line trench 11 in region B.

Figure 9:
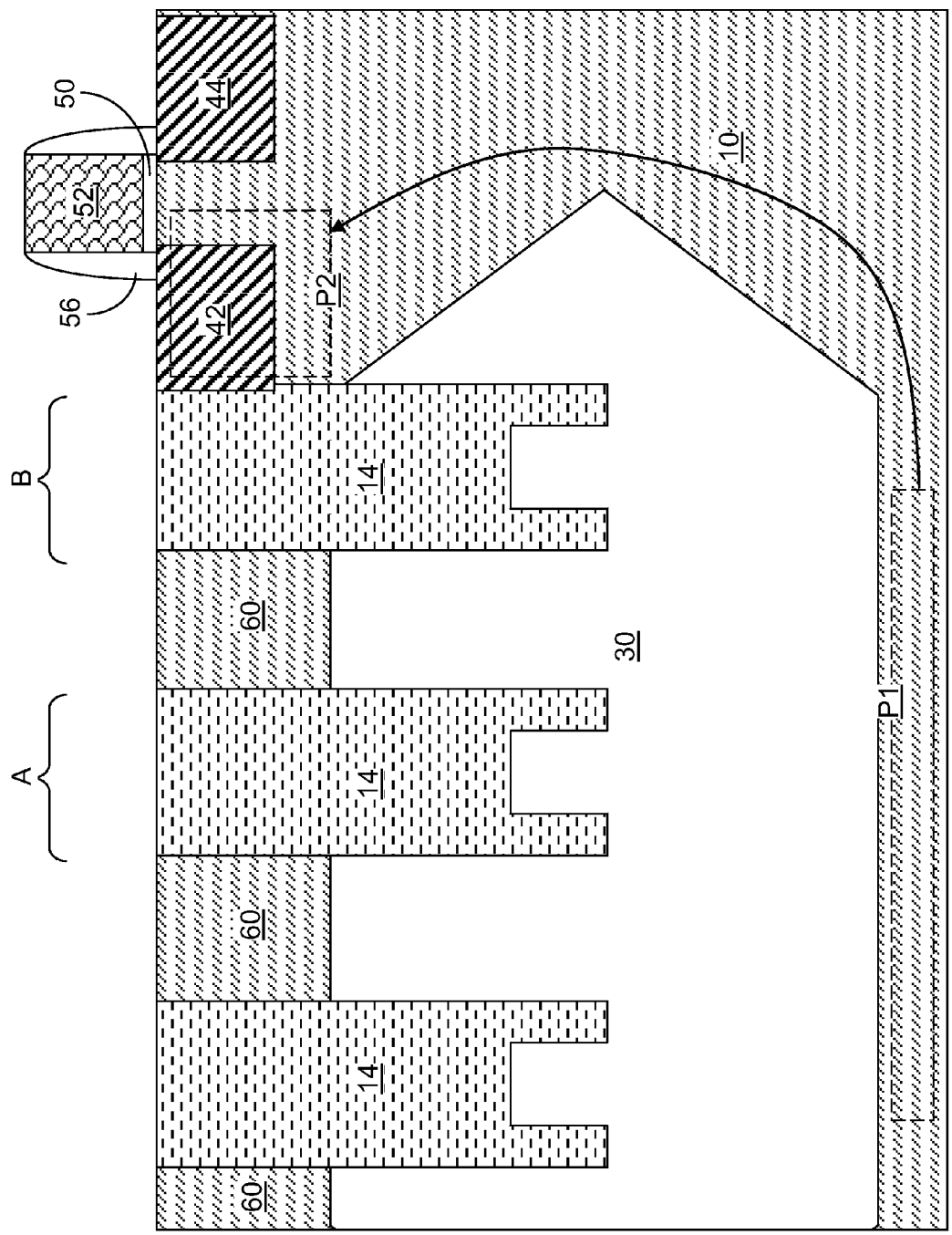
FIG. 9 is a vertical cross-sectional view of the first exemplary semiconductor structure after formation of trench isolation structures and additional semiconductor components according to the first embodiment of the present disclosure.
Figure 10:
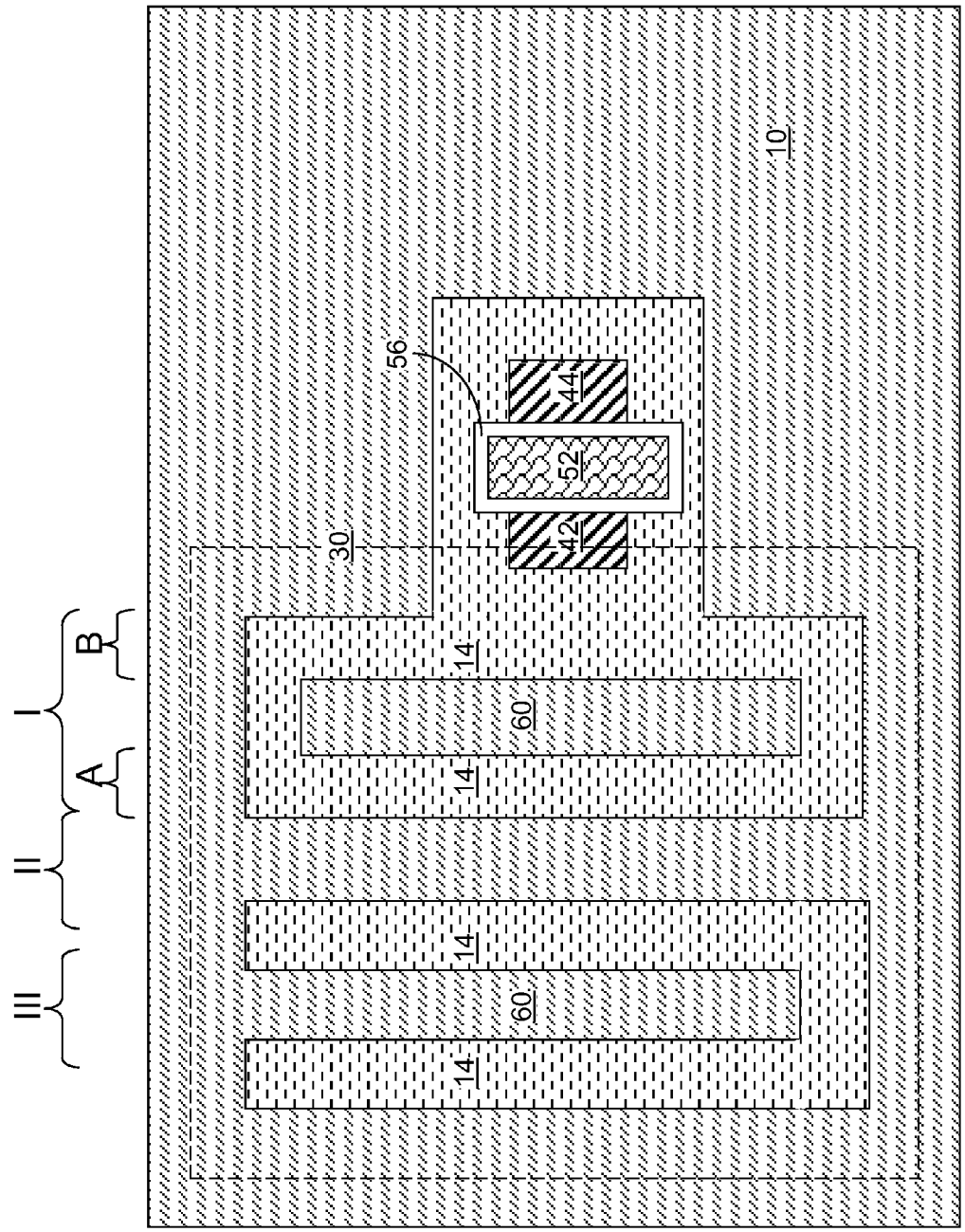
FIG. 10 is a top-down view of the first exemplary semiconductor structure of FIG. 9 according to the first embodiment of the present disclosure.

Referring to FIGS. 9 and 10, trench isolation structures 14 can be formed by filling the line trenches 11 with a dielectric material such as silicon oxide, silicon nitride, and/or silicon oxynitride. FIG. 9 is a vertical cross-sectional view and FIG.

10 is a top down view employing a different scale for the view. The dielectric material can be deposited, for example, by chemical vapor deposition (CVD). Excess dielectric material above the top surface of the semiconductor substrate 8 can be removed, for example, by a recess etch or chemical mechanical planarization (CMP).

Additional semiconductor components and/or addition semiconductor devices such as field effect transistors, junction transistors, diodes, resistors, capacitors, inductors, varactors, thyristors, nanotube devices, and/or optoelectronic devices. As a non-limiting illustrative example, the additional semiconductor components can include a field effect transistor, which includes a source region 42, a drain region 44, a gate dielectric 50, a gate electrode 52, and a gate spacer 56. A portion of the semiconductor substrate 10 can function as the channel of the field effect transistor.

The lateral extent of the integral contiguous semiconductor oxide portion 30 is illustrated with a dotted line in FIG. 10. The lateral extent of the integral contiguous semiconductor oxide portion 30 is greater than the lateral extent of a set of trench isolation structures 14 that fills the line trenches 11 because the thermal oxidation process proceeds laterally outward from outermost peripheries of the line trenches 11 during the processing step of FIGS. 5-7. Thus, the semiconductor substrate 11 includes a portion, which is herein referred to as a first portion P1, that underlies the integral contiguous semiconductor oxide portion 30. The semiconductor substrate 11 further includes another portion, which is herein referred to as a second portion P2, that overlies a peripheral portion of the integral contiguous semiconductor oxide portion 30. The semiconductor substrate 10 contiguously extends from the first portion P1 underlying the integral contiguous semiconductor oxide portion 30 to the second portion P2 overlying a peripheral portion of the integral contiguous semiconductor oxide portion 30. One or more of the additional semiconductor components or semiconductor devices, e.g., the source region 42, can be located on, or in, the second portion P2. It is understood that the field effect transistor in FIG. 9 can be replaced with any semiconductor component or device or optoelectronic component or device known in the art.

The semiconductor material portions 60 are laterally spaced from the second portion P2 by at least one line trench 11, each of which is filled with a trench isolation structure 14. The integral contiguous semiconductor oxide portion 30 includes a thermal oxide of the semiconductor material of the semiconductor substrate 11, which can be the same as the semiconductor material of the semiconductor material portions 60. Each semiconductor material portion 60 is in contact with a top surface of the integral contiguous semiconductor oxide portion 30.

A semiconductor material portion 60 may be laterally encircled by trench isolation structures 14 filling a set of contiguous line trenches 11 as in region I. For example, the trench isolation structures 14 filling the first line trench 11 in region A, the second line trench in region B, and at least another line trench connecting the first line trench 11 in region A and the second line trench 11 in region B contiguously surrounds the semiconductor material portion 60 laterally. Alternately, a semiconductor material portion 60 may be directly connected to the semiconductor substrate 10 at both ends of the lengthwise direction as in region II. Yet alternately, a semiconductor material portion 60 may be directly connected to the semiconductor substrate 10 at one end of the lengthwise direction as in region III. In one embodiment, the width and the height of each semiconductor material portion 60 can be selected to enable confinement of infrared or visible radiation so that the semiconductor material portion(s) 60 can function as a waveguide.

Figure 11:
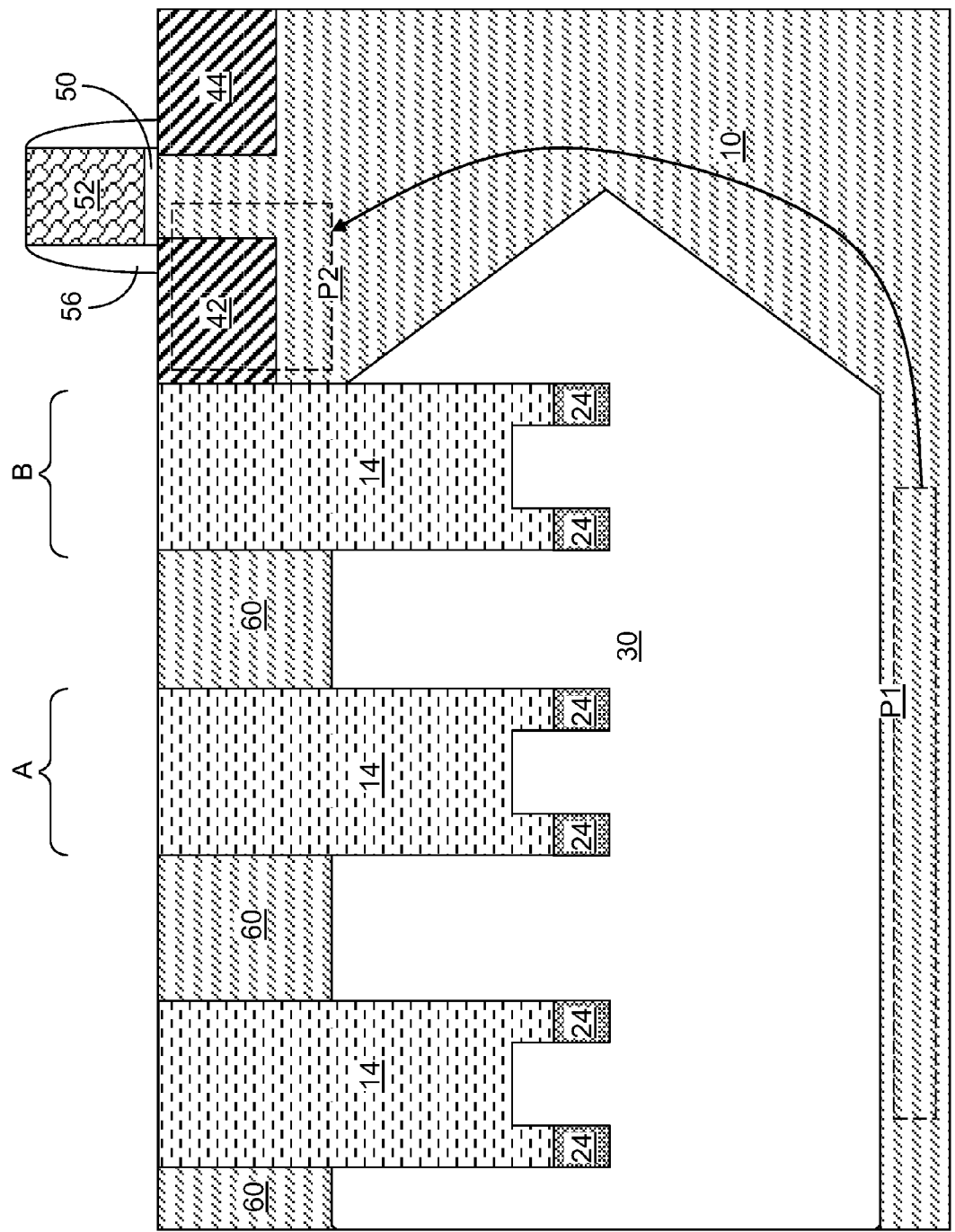
FIG. 11 is a vertical cross-sectional view of a variation of the first exemplary semiconductor structure according to the first embodiment of the present disclosure.

Referring to FIG. 11, a variation of the first exemplary semiconductor structure is shown. At a processing step corresponding to FIG. 8, the removal of the oxygen-impermeable spacers 22 can be incomplete. In this case, a first pair of oxygen-impermeable material portions 24 can be formed at a bottom of the first line trench, which is located in region A and filled with a trench isolation structure 14, and embedded in the integral contiguous semiconductor oxide portion 30. A second pair of oxygen-impermeable material portions 24 can be located at a bottom of the second line trench, which is located in region B and is filled with another trench isolation structure 14, and embedded in the contiguous semiconductor oxide portion 30.

Figure 12:
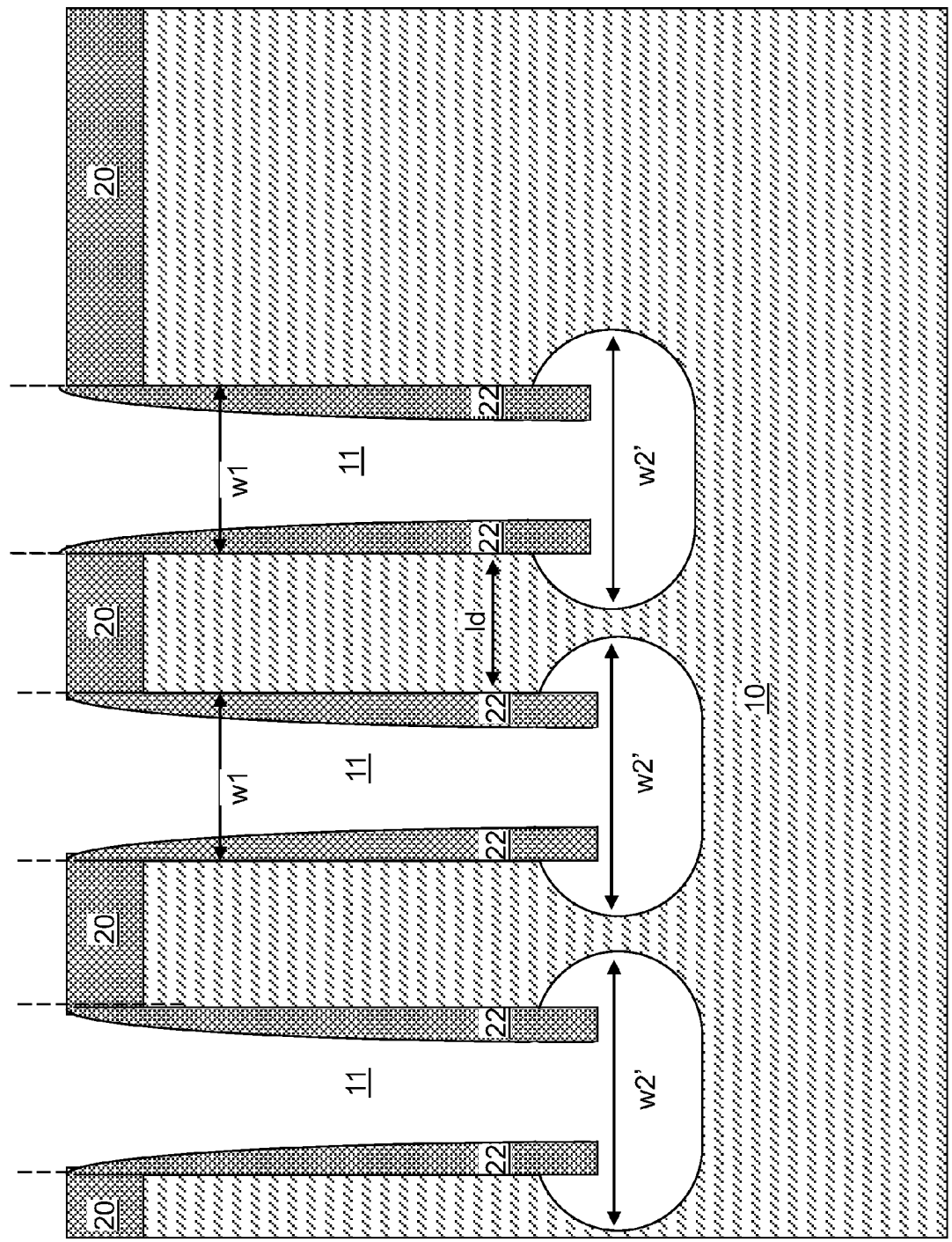
FIG. 12 is a vertical cross-sectional view of a second exemplary semiconductor structure after an isotropic etch of the semiconductor material of the semiconductor substrate according to a second embodiment of the present disclosure.

Referring to FIG. 12 a second exemplary semiconductor structure according to a second embodiment of the present disclosure can be derived from the first exemplary semiconductor structure of FIG. 4 by performing an isotropic etch of the semiconductor material of the semiconductor substrate 10, for example, by a dry or wet etch. The isotropic etch employs the oxygen-impermeable layer 20 and the oxygen-impermeable spacers 22 as an etch mask. The line trenches 11 are vertically and laterally expanded so the width of a vertically and laterally expanded portion of the line trenches 11, which is herein referred to as a second width w2', is greater then the first width w1. The vertically and laterally expanded portion of the line trenches 11 having a greater width than the first width w1 is herein referred to as a "bottle-shaped portion" of the line trench 11.

Figure 13:
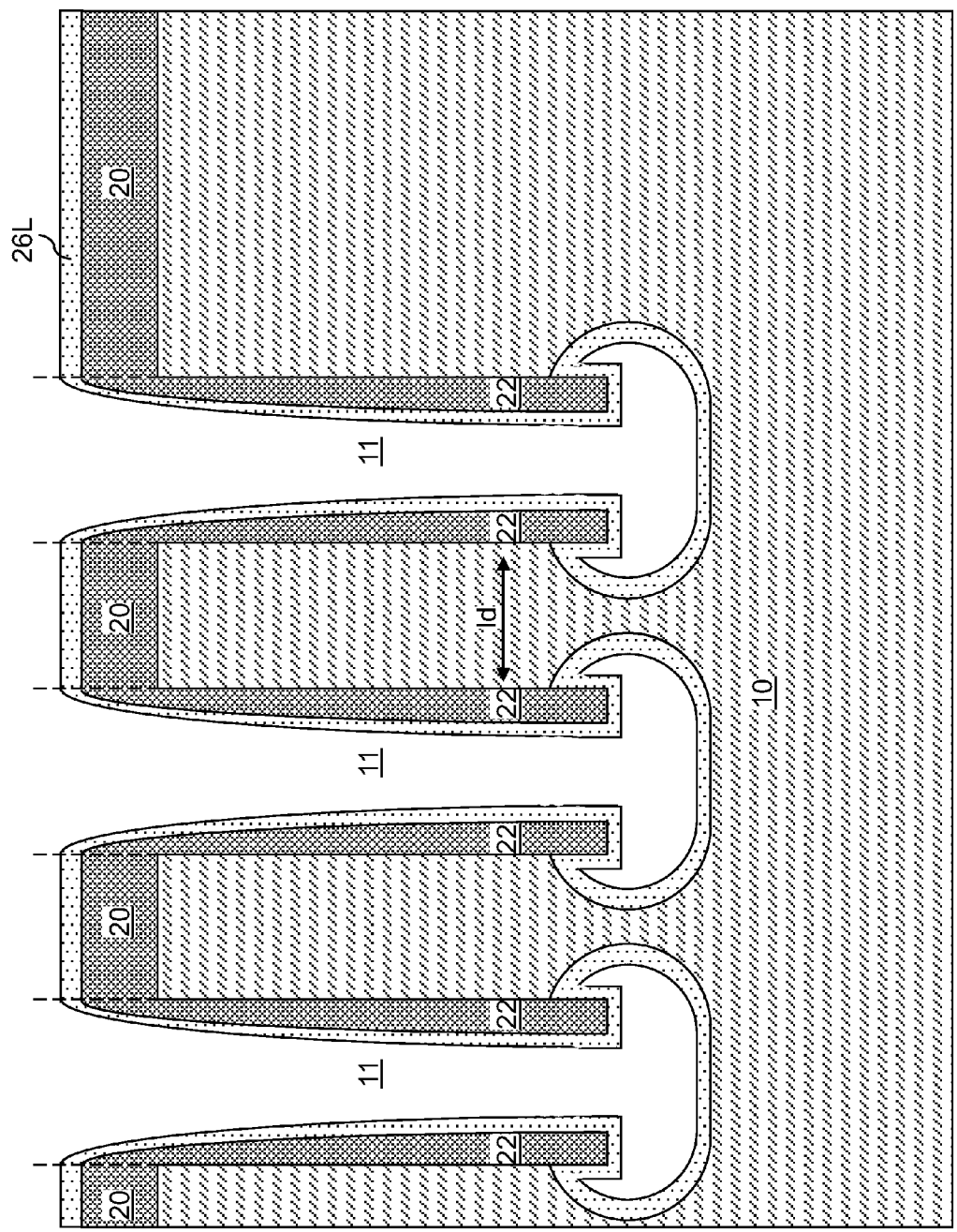
FIG. 13 is a vertical cross-sectional view of the second exemplary semiconductor structure after conformal deposition of a third oxygen-impermeable layer according to the second embodiment of the present disclosure.

Referring to FIG. 13, a third oxygen-impermeable layer 26L is conformally deposited, for example, by chemical vapor deposition (CVD) or atomic layer deposition (ALD). The third oxygen-impermeable layer 26L can include any of the oxygen-impermeable material that can be employed for the oxygen-impermeable layer 20. The thickness of the third oxygen-impermeable layer 26 can be from 5 nm to 1,000 nm, although lesser and greater thicknesses can also be employed, and is selected to avoid sealing any of the liner trenches 11.

While the present disclosure is described employing an embodiment in which the oxygen-impermeable spacers 22 are not removed prior to deposition of the third oxygen-impermeable layer 26L, embodiments are expressly contemplated herein in which the oxygen-impermeable spacers 22 are removed prior to deposition of the third oxygen-impermeable layer 26L. In this case, the thickness of the oxygen-impermeable layer 20 can decrease due to the removal of the top portion of the oxygen-impermeable layer 20 during the etch that removes the oxygen-impermeable spacers 22. Subsequently, the third oxygen-impermeable layer 26L is deposited on the top surface and sidewalls of the oxygen-impermeable layer 20.

Figure 14:
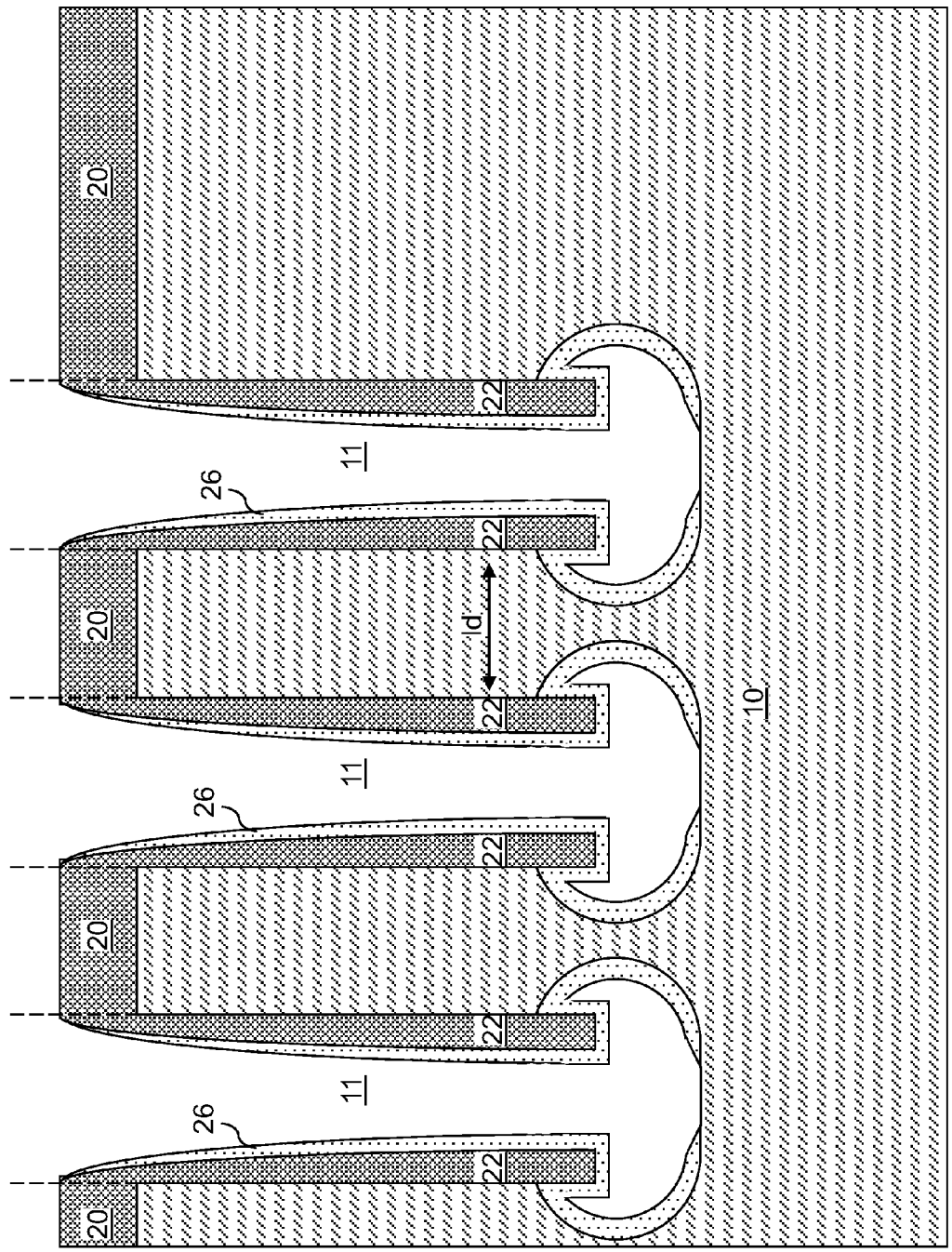
FIG. 14 is a vertical cross-sectional view of the second exemplary semiconductor structure after formation of second oxygen-impermeable spacers according to the second embodiment of the present disclosure.

Referring to FIG. 14, an anisotropic etch is performed to remove horizontal portions of the third oxygen-impermeable layer 26L. The anisotropic etch can be, for example, a reactive ion etch in which ions in a plasma impinge on the second exemplary structure with directionality such that most ions have a substantial downward momentum. Thus, the portion of the third oxygen-impermeable layer 26L above the top surface of the oxygen-impermeable layer 20 is removed, and bottommost portions of the third oxygen-impermeable layer 26L at the bottom of each line trench 11 are also removed. The remaining portions f the third oxygen-impermeable layer 26L constitute second oxygen-impermeable spacers 26.

Figure 15:
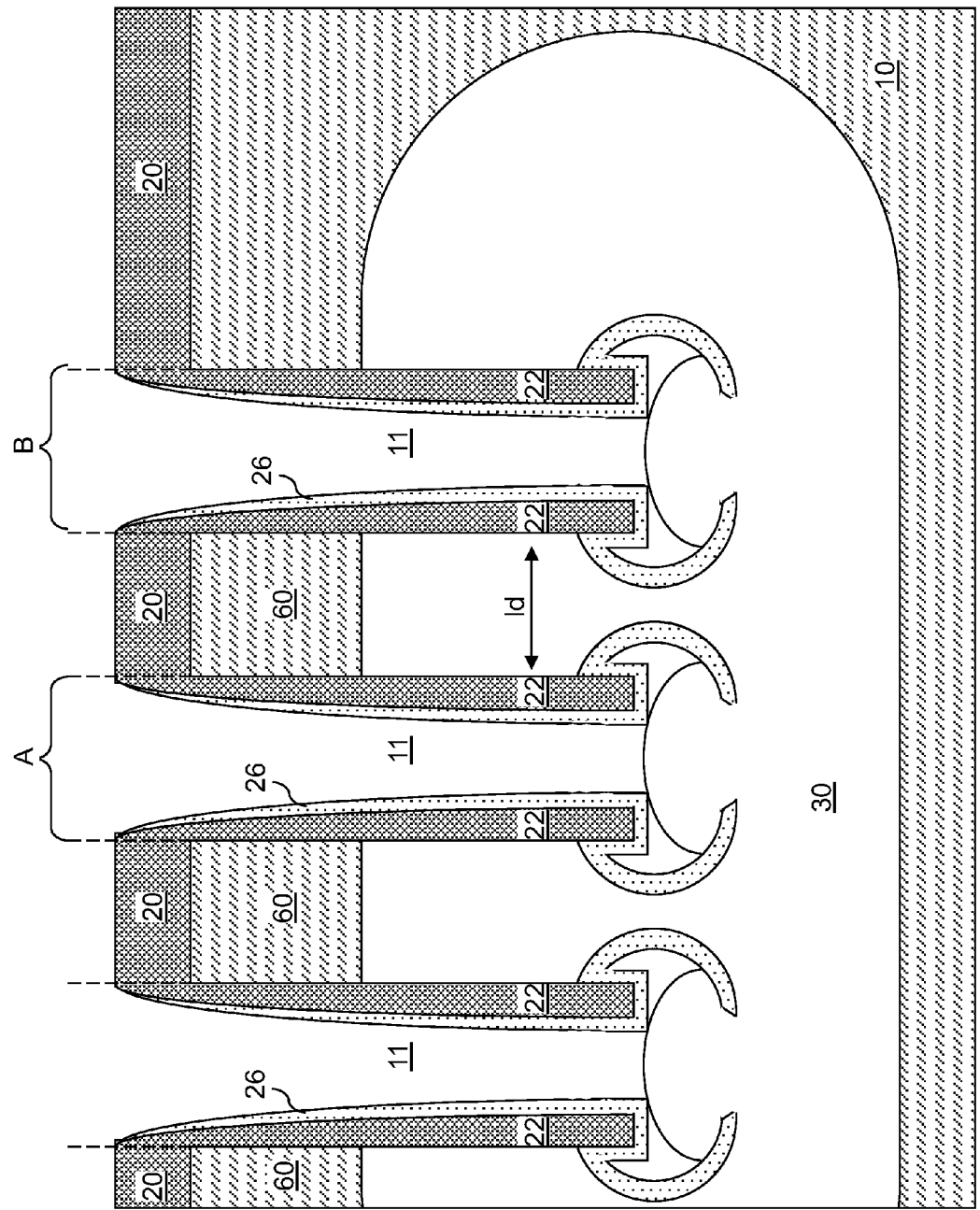
FIG. 15 is a vertical cross-sectional view of the second exemplary semiconductor structure after formation of an integral contiguous semiconductor oxide portion according to the second embodiment of the present disclosure.

Referring to FIG. 15, the processing steps of FIGS. 5, 6, and 7 are performed to form an integral contiguous semiconductor oxide portion 30. Due to volume expansion during the oxidation of the semiconductor material of the semiconductor substrate 10, portions of the integral contiguous semiconductor oxide portion 30 can be raised above the bottommost portions of the second oxygen-impermeable spacers 26 and into the bottle-shaped portions of the line trenches 11. The top surfaces of the integral contiguous semiconductor oxide portion 30 can be convex within the bottle-shaped portions of the line trenches 11.

Semiconductor material portions 60 are formed above the integral contiguous semiconductor oxide portion 30. Each semiconductor material portion 60 is laterally bounded by vertical sidewalls of the oxygen-impermeable spacers 22. The oxidation of the semiconductor material of the semiconductor substrate 10 is performed for a duration that is sufficient to provide a planar interface between each bottom surface of the semiconductor material portions 60 and the top surface of the integral contiguous semiconductor oxide portion 30. Thus, each semiconductor material portions 60 can have a constant thickness throughout, which can be, for example, from 5 nm to 300 nm, although lesser and greater thicknesses can also be employed.

Figure 16:
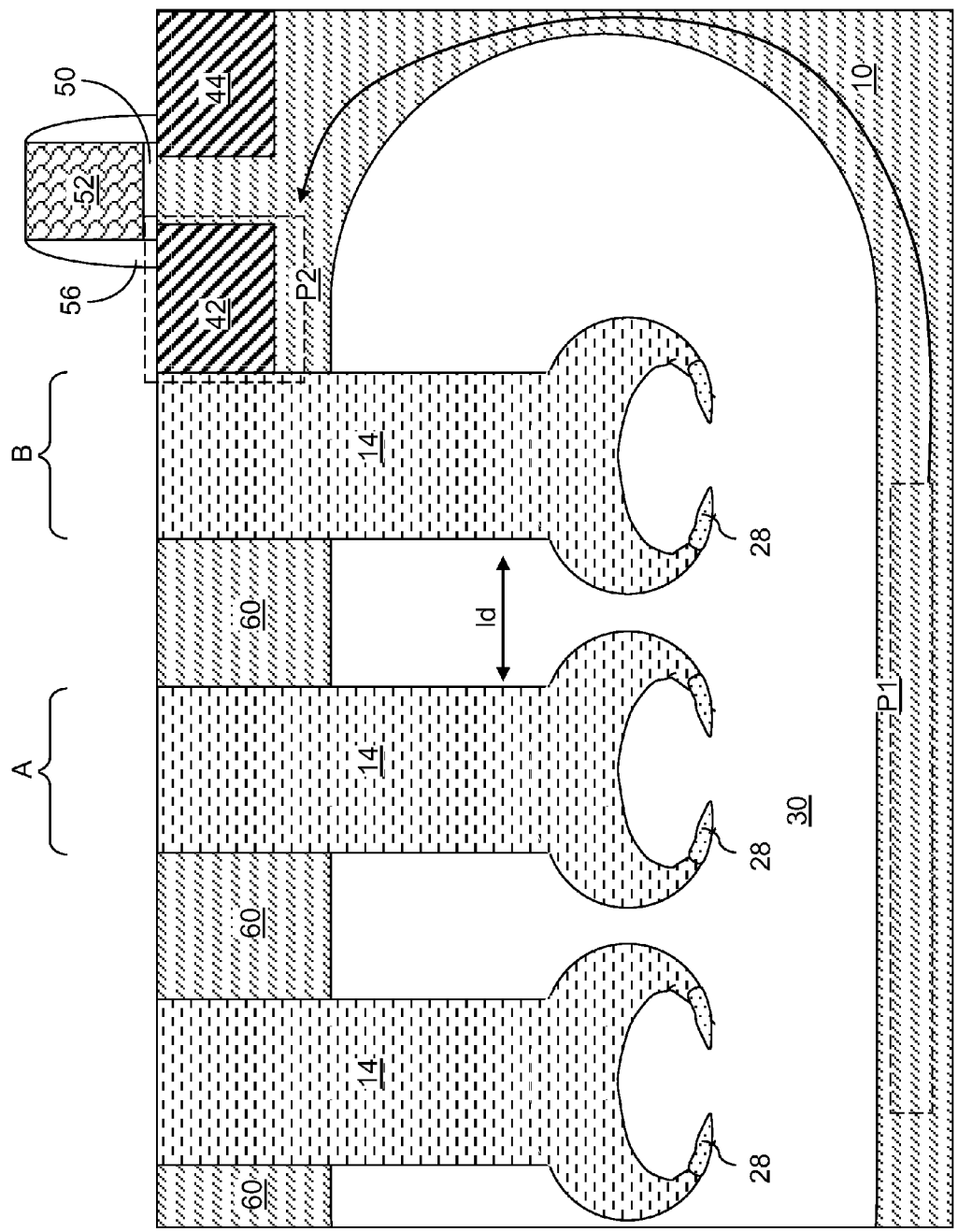
FIG. 16 is a vertical cross-sectional view of the second exemplary semiconductor structure after formation of trench isolation structures and additional semiconductor components according to the second embodiment of the present disclosure.

Referring to FIG. 16, the oxygen-impermeable layer 20, the oxygen-impermeable spacers 22, and the second oxygen-impermeable spacers 26 are removed employing the same method as in the first embodiment. Particularly, the second oxygen-impermeable spacers 26 can be removed during the same etch step that removes the oxygen-impermeable layer 20 and the oxygen-impermeable spacers 22.

Trench isolation structures and additional semiconductor components can be formed in the same manner as in the first embodiment, i.e., by performing the processing steps of FIGS. 9 and 10 or 11. The second oxygen-impermeable spacers 26 may, or may not, be completely removed after formation of the integral contiguous semiconductor oxide portion 30. If the second oxygen-impermeable spacers 26 are not completely removed, remaining portions of the second oxygen-impermeable spacers 26 can constitute pairs of oxygen-impermeable material portions 28 located at a bottom of each line trench.

Figure 17:
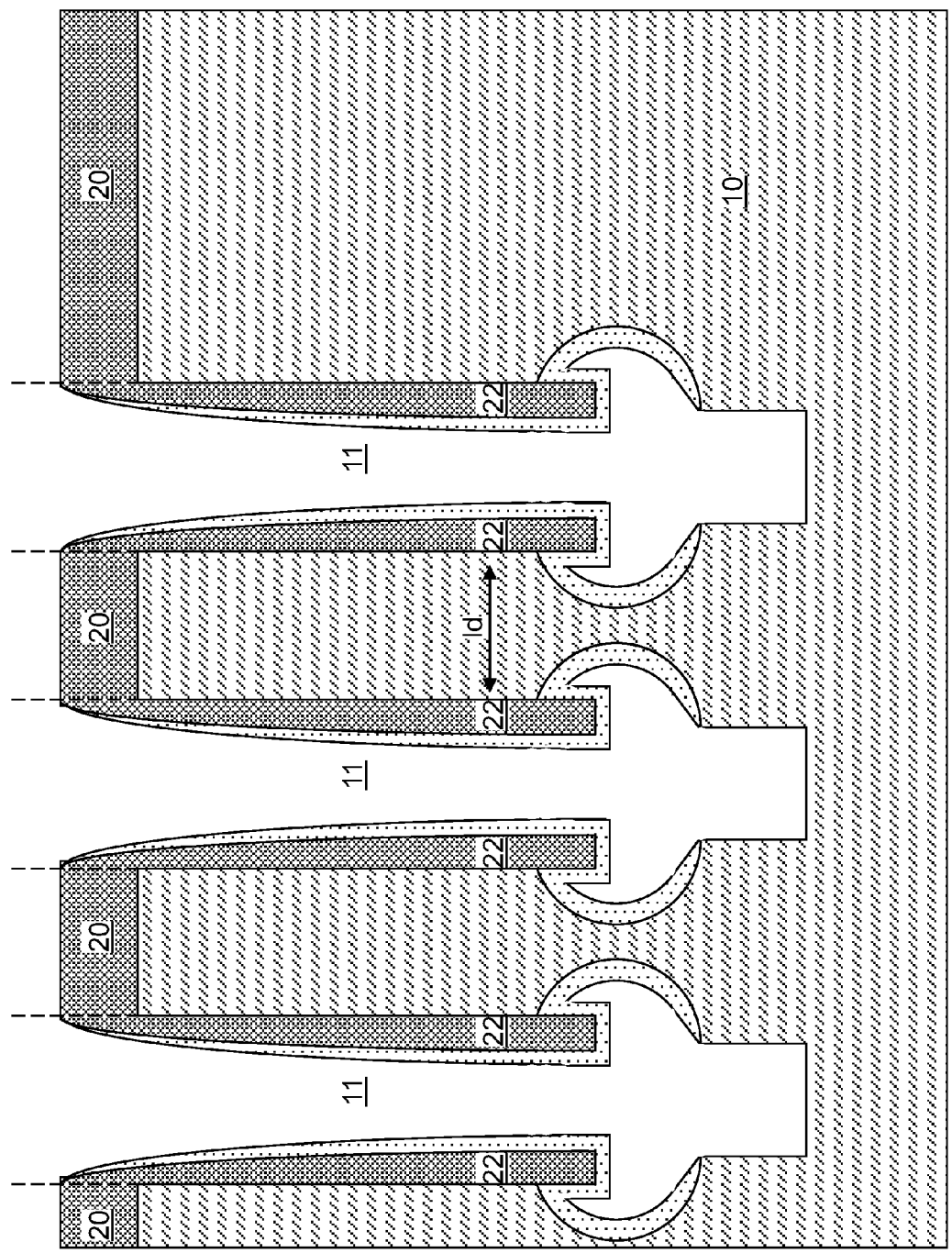
FIG. 17 is a vertical cross-sectional view of a third exemplary structure after an anisotropic etch that vertically extends line trenches by anisotropically etching the semiconductor material of the semiconductor substrate according to a third embodiment of the present disclosure.

Referring to FIG. 17, a third exemplary structure according to a third embodiment of the present disclosure can be derived from the second exemplary semiconductor structure of FIG. 14 by anisotropically etching the semiconductor material of the semiconductor substrate 10. An anisotropic etch such as a reactive ion etch can be employed. The anisotropic etch vertically extends downward the line trenches 11. The sidewalls of the vertically extended portion of each line trench 11 that underlies the bottle-shaped portion can be substantially vertical. The depth of the vertically extended portion of each line trench 11 can be, for example, from 50 nm to 10,000 nm, although lesser and greater depths can also be employed.

Figure 18:
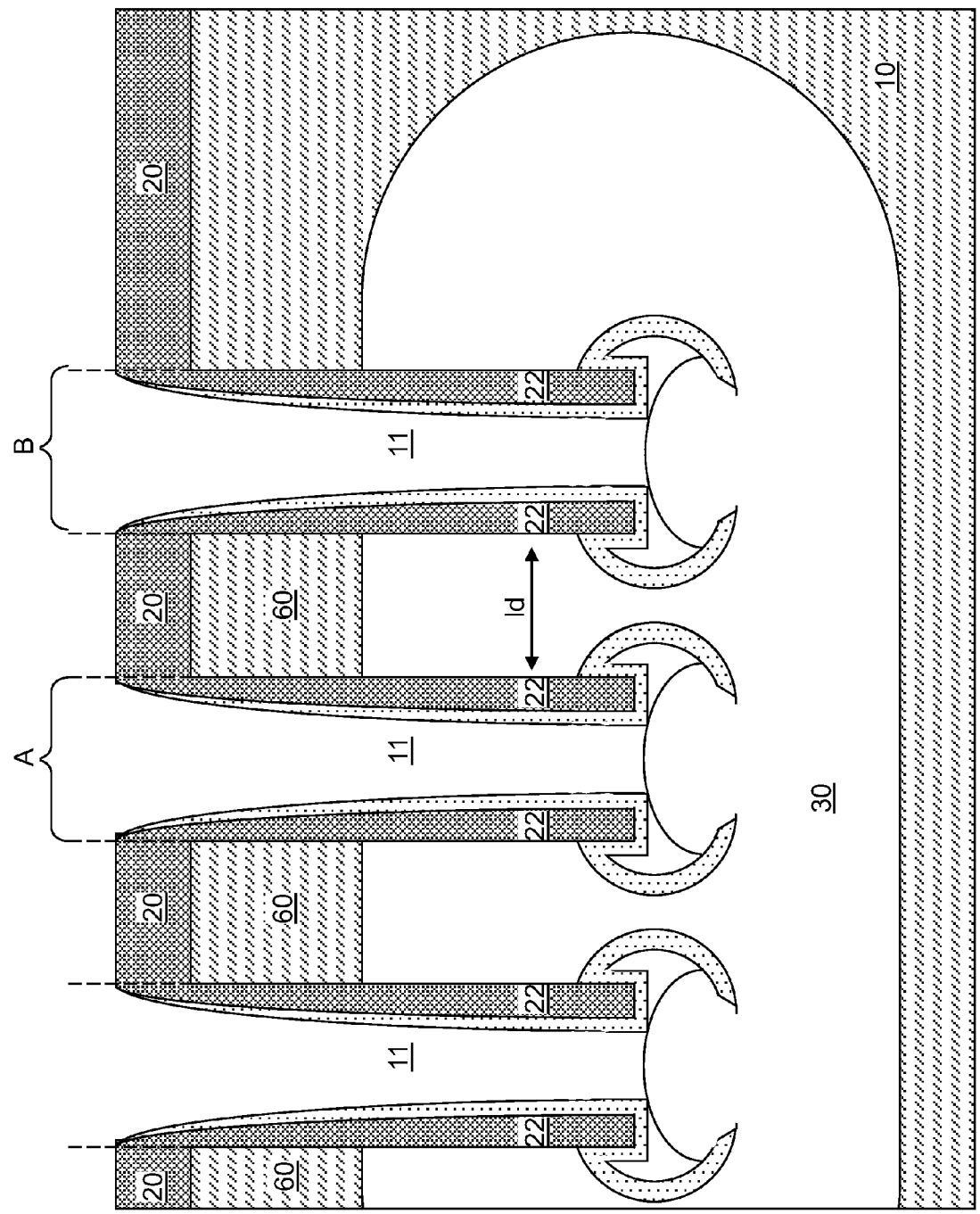
FIG. 18 is a vertical cross-sectional view of the third exemplary semiconductor structure after formation of an integral contiguous semiconductor oxide portion according to the third embodiment of the present disclosure.

Referring to FIG. 18, the processing steps of FIGS. 5, 6, and 7 are performed to form an integral contiguous semiconductor oxide portion 30. Depending on the depth of the vertically extended portion of each line trench 11 and the amount of volume expansion during the oxidation of the semiconductor material of the semiconductor substrate 10, portions of the integral contiguous semiconductor oxide portion 30 can be raised above the bottommost portions of the second oxygen-impermeable spacers 26 and form convex surfaces.

Semiconductor material portions 60 are formed above the integral contiguous semiconductor oxide portion 30. Each semiconductor material portion 60 is laterally bounded by vertical sidewalls of the oxygen-impermeable spacers 22. The oxidation of the semiconductor material of the semiconductor substrate 10 is performed for a duration that is sufficient to provide a planar interface between each bottom surface of the semiconductor material portions 60 and the top surface of the integral contiguous semiconductor oxide portion 30. Thus, each semiconductor material portions 60 can have a constant thickness throughout, which can be, for example, from 5 nm to 300 nm, although lesser and greater thicknesses can also be employed.

Figure 19:
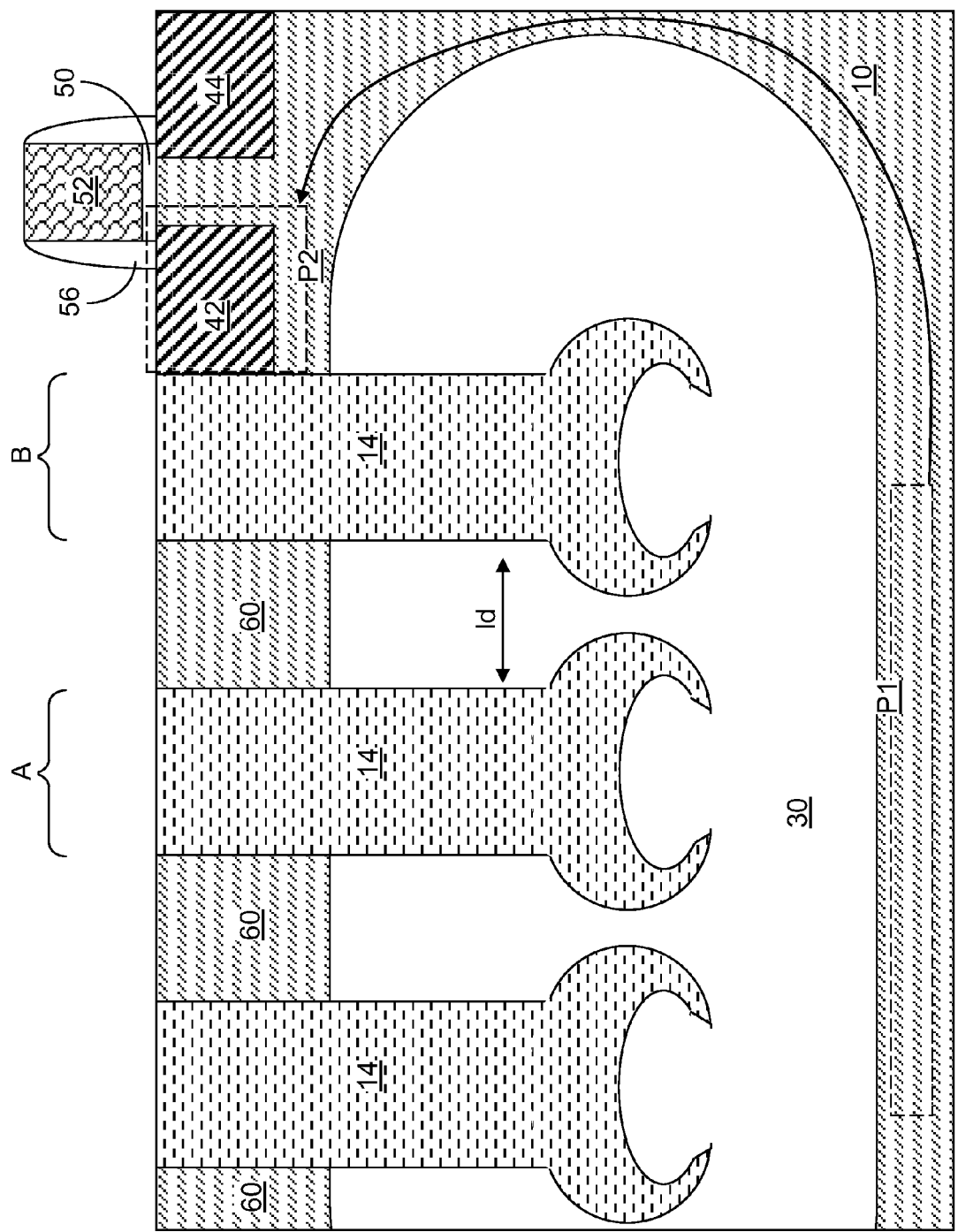
FIG. 19 is a vertical cross-sectional view of the third exemplary semiconductor structure after formation of trench isolation structures and additional semiconductor components according to the third embodiment of the present disclosure.

Referring to FIG. 19, trench isolation structures and additional semiconductor components can be formed in the same manner as in the first embodiment, i.e., by performing the processing steps of FIGS. 9 and 10 or 11. The second oxygen-impermeable spacers 26 can be completely removed after formation of the integral contiguous semiconductor oxide portion 30.

Figure 20:
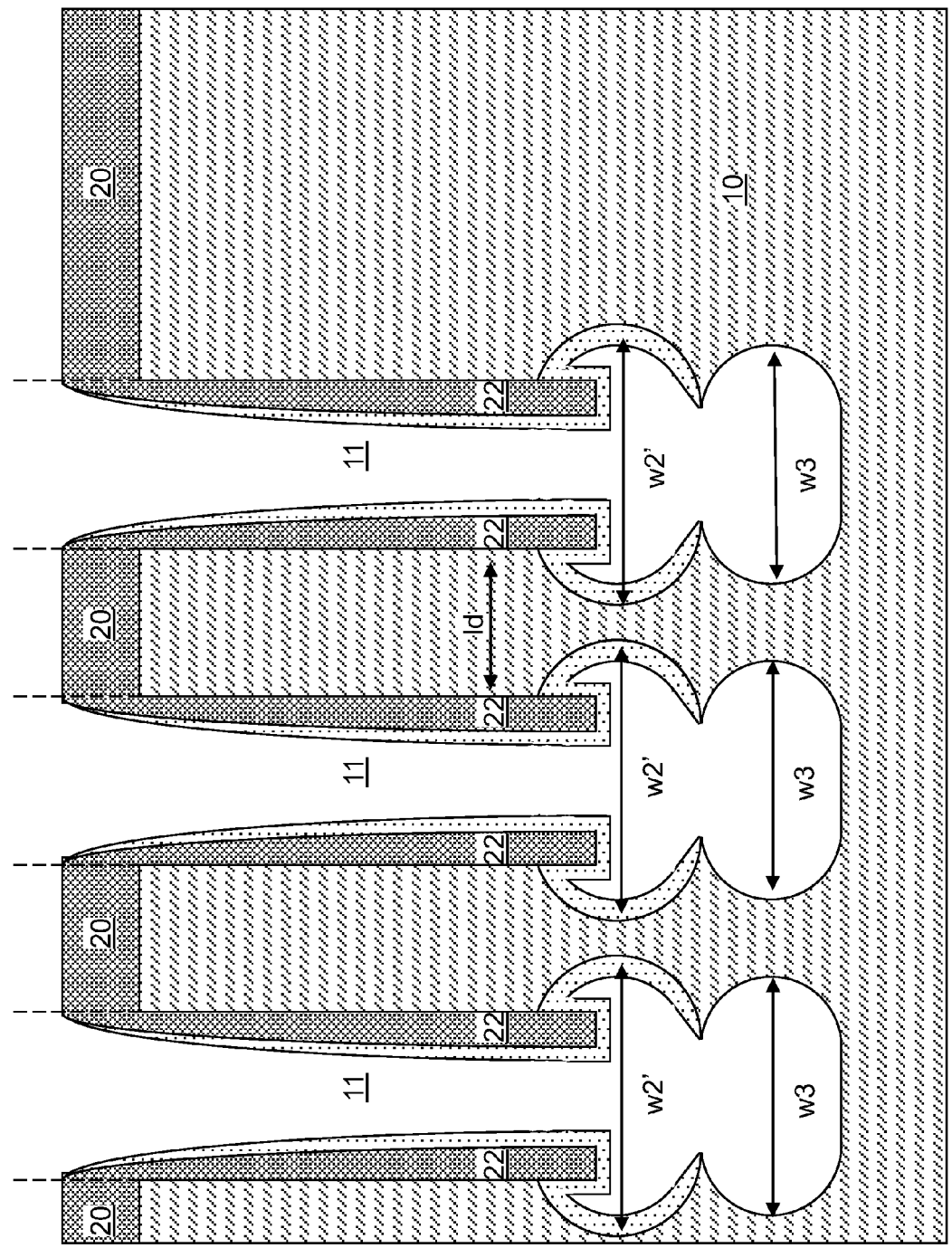
FIG. 20 is a vertical cross-sectional view of a fourth exemplary semiconductor structure after formation of a second bottle-shaped portion underneath each bottle-shaped portion of the line trenches according to a fourth embodiment of the present disclosure.

Referring to FIG. 20, a fourth exemplary semiconductor structure according to the fourth embodiment of the present disclosure can be derived from the second exemplary semiconductor structure of FIG. 14 or from the third exemplary semiconductor structure of FIG. 17 by forming a second bottle-shaped portion underneath each bottle-shaped portion of the line trenches 11. Specifically, an isotropic etch is performed on the semiconductor material of the semiconductor substrate 10. The isotropic etch can be, for example, a dry or wet etch. The line trenches 11 are vertically and laterally expanded underneath each bottle-shaped portion to form a second bottle-shaped portion having a third width w3. The third width w3 can be is greater then the first width w1.

Figure 21:
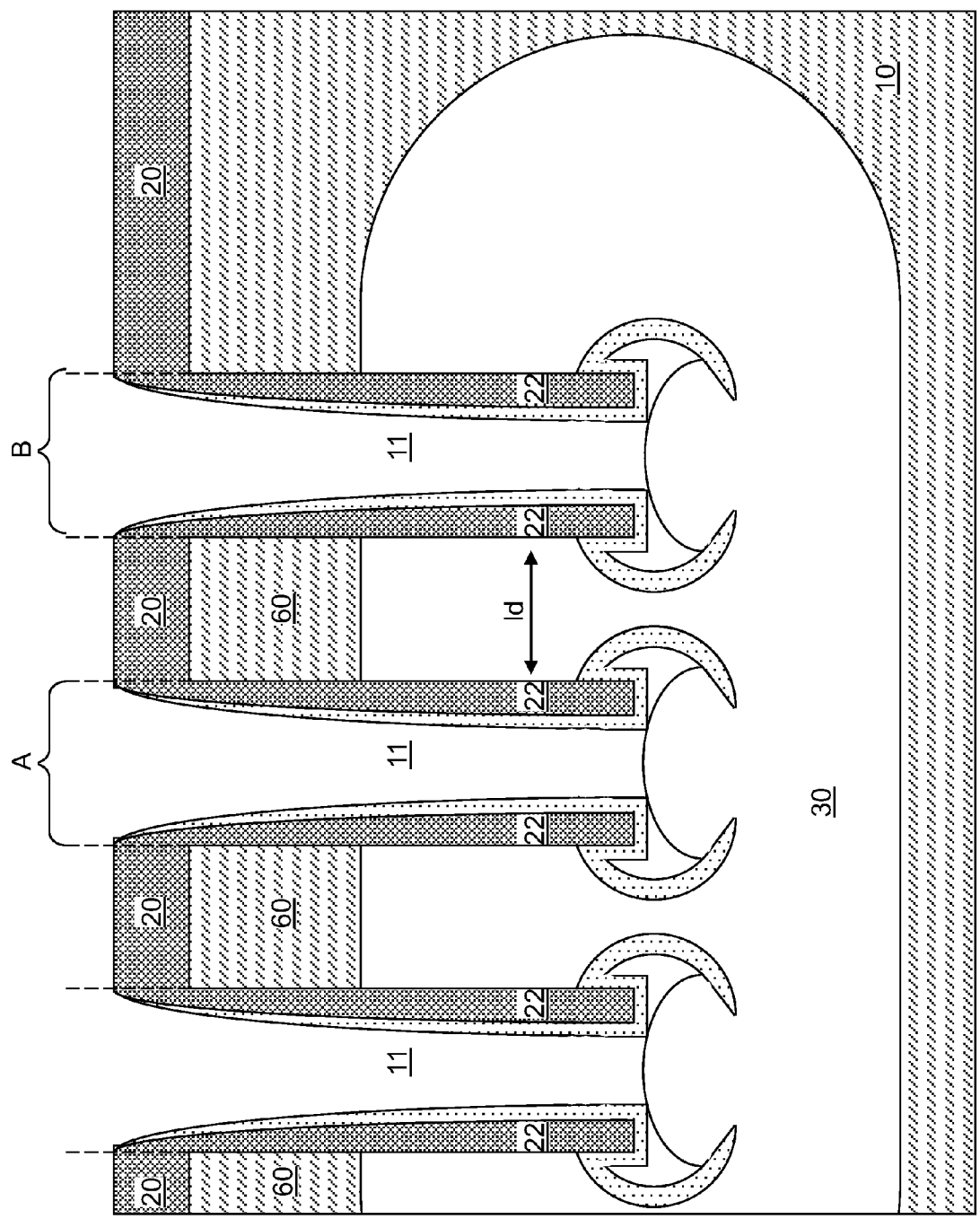
FIG. 21 is a vertical cross-sectional view of a fourth exemplary semiconductor structure after formation of an integral contiguous semiconductor oxide portion according to the fourth embodiment of the present disclosure.

Referring to FIG. 21, the processing steps of FIGS. 5, 6, and 7 are performed to form an integral contiguous semiconductor oxide portion 30. The volume expansion during the oxidation of the semiconductor material of the semiconductor substrate 10 can be accommodated by the second bottle-shaped portion of the line trenches 11. The integral contiguous semiconductor oxide portion 30 can include convex surfaces located above the bottommost surfaces of the bottle-shaped portions of the line trenches 11.

Semiconductor material portions 60 are formed above the integral contiguous semiconductor oxide portion 30. Each semiconductor material portion 60 is laterally bounded by vertical sidewalls of the oxygen-impermeable spacers 22. The oxidation of the semiconductor material of the semiconductor substrate 10 is performed for a duration that is sufficient to provide a planar interface between each bottom surface of the semiconductor material portions 60 and the top surface of the integral contiguous semiconductor oxide portion 30. Thus, each semiconductor material portions 60 can have a constant thickness throughout, which can be, for example, from 5 nm to 300 nm, although lesser and greater thicknesses can also be employed.

Figure 22:
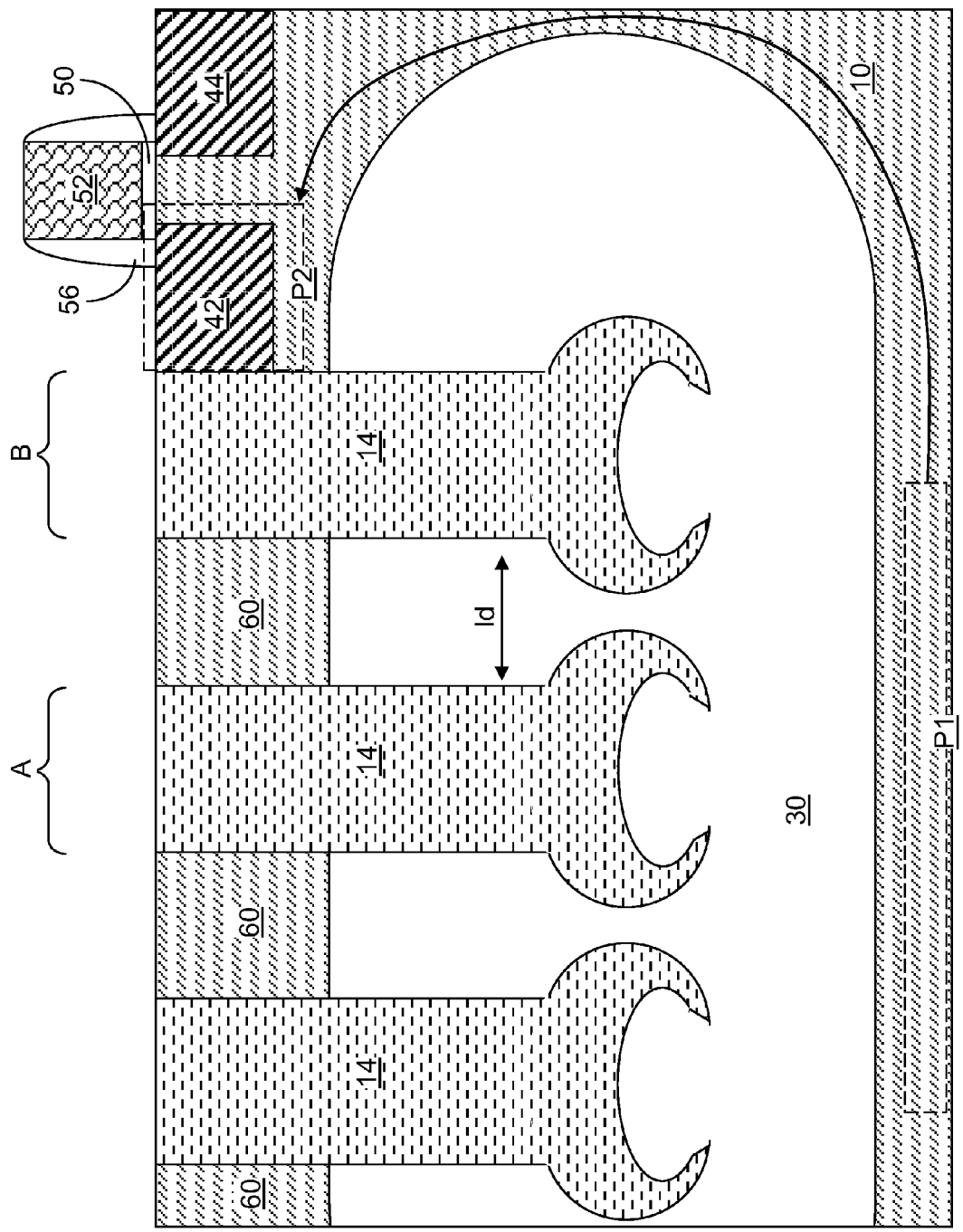
FIG. 22 is a vertical cross-sectional view of the fourth exemplary semiconductor structure after formation of trench isolation structures and additional semiconductor components according to the fourth embodiment of the present disclosure.

Referring to FIG. 22, trench isolation structures and additional semiconductor components can be formed in the same manner as in the first embodiment, i.e., by performing the processing steps of FIGS. 9 and 10 or 11. The second oxygen-impermeable spacers 26 can be completely removed after formation of the integral contiguous semiconductor oxide portion 30.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
a semiconductor oxide portion embedded within a semiconductor substrate, wherein said semiconductor substrate contiguously extends from a first portion underlying said semiconductor oxide portion to a second portion overlying a peripheral portion of said semiconductor oxide portion;
a semiconductor material portion having a planar bottom surface that is in contact with a planar top surface of said semiconductor oxide portion and comprising a same semiconductor material as said second portion;
a first line trench located on one side of said semiconductor material portion and extending into said semiconductor oxide portion; and
a second line trench located on an opposite side of said semiconductor material portion and extending into said semiconductor oxide portion, wherein said semiconductor material portion laterally extends between a first sidewall of said first line trench and a second sidewall of said second line trench, and is laterally spaced from said second portion by one of said first line trench and said second line trench, and wherein each bottom surface of said first and second line trenches comprises a non-planar convex surface of said semiconductor oxide portion or a pair of grooves between which a portion said semiconductor oxide portion protrudes above bottommost surfaces of said grooves.

2. The semiconductor structure of claim 1, wherein said first sidewall includes a first semiconductor sidewall of said semiconductor material portion and a first semiconductor oxide sidewall of said semiconductor material portion, and said second sidewall includes a second semiconductor sidewall of said semiconductor material portion and a second semiconductor oxide sidewall of said semiconductor material portion.

3. The semiconductor structure of claim 2, wherein said first semiconductor sidewall is parallel to said second semiconductor sidewall.

4. The semiconductor structure of claim 3, wherein said first semiconductor sidewall and said second semiconductor sidewall are parallel to a sidewall of said second portion.

5. The semiconductor structure of claim 1, wherein a bottom surface of said semiconductor material portion is substantially planar.

6. The semiconductor structure of claim 1, further comprising at least one semiconductor device located on, or in, said second portion.

7. The semiconductor structure of claim 1, wherein said first line trench, said second line trench, and at least another line trench contiguously surrounds said semiconductor material portion laterally as a set of contiguous line trenches.

8. The semiconductor structure of claim 1, further comprising at least one shallow trench isolation structure comprising a dielectric material and filling said first line trench and said second line trench.

9. The semiconductor structure of claim 1, wherein said semiconductor material portion and said semiconductor substrate include a same single crystalline semiconductor material.

10. The semiconductor structure of claim 9, wherein semiconductor oxide portion comprises a thermal oxide of said same semiconductor material.

11. The semiconductor structure of claim 1, further comprising:
a first pair of oxygen-impermeable material portions located at a bottom of said first line trench and embedded in said semiconductor oxide portion; and
a second pair of oxygen-impermeable material portions located at a bottom of said second line trench and embedded in said semiconductor oxide portion.

12. The semiconductor structure of claim 11, wherein a sidewall of one of said first pair of oxygen-impermeable material portions is vertically coincident with said first sidewall of said first line trench, and a sidewall of one of said second pair of oxygen-impermeable material portions is vertically coincident with said second sidewall of said second line trench.

* * * * *